(12) United States Patent
Li et al.

(10) Patent No.: US 11,973,052 B2
(45) Date of Patent: Apr. 30, 2024

(54) STUD BUMP FOR WIREBONDING HIGH VOLTAGE ISOLATION BARRIER CONNECTION

(71) Applicant: Texas Instruments Incorporated, Dallas, TX (US)

(72) Inventors: Chien-Chang Li, New Taipei (TW); Hung-Yu Chou, Taipei (TW); Sheng-Wen Huang, Taipei (TW); Zi-Xian Zhan, New Taipei (TW); Byron Lovell Williams, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 269 days.

(21) Appl. No.: 17/242,380

(22) Filed: Apr. 28, 2021

(65) Prior Publication Data

US 2022/0352111 A1 Nov. 3, 2022

(51) Int. Cl.
*H01L 23/00* (2006.01)
*H01L 21/48* (2006.01)
*H01L 21/56* (2006.01)
*H01L 23/31* (2006.01)
*H01L 23/495* (2006.01)

(52) U.S. Cl.
CPC .......... *H01L 24/48* (2013.01); *H01L 21/4825* (2013.01); *H01L 21/565* (2013.01); *H01L 23/3107* (2013.01); *H01L 23/49513* (2013.01); *H01L 23/4952* (2013.01); *H01L 23/49575* (2013.01); *H01L 24/85* (2013.01); *H01L 2224/48137* (2013.01); *H01L 2224/48245* (2013.01); *H01L 2224/48465* (2013.01); *H01L 2224/48479* (2013.01); *H01L 2224/85051* (2013.01); *H01L 2224/85205* (2013.01)

(58) Field of Classification Search
CPC ..... H01L 24/48; H01L 24/85; H01L 21/4825; H01L 21/565; H01L 21/56; H01L 23/3107; H01L 23/49513; H01L 23/4952; H01L 23/49575
See application file for complete search history.

(56) References Cited

U.S. PATENT DOCUMENTS

2002/0125555 A1* 9/2002 Akiyama .............. H01L 25/162 257/692
2019/0206769 A1 7/2019 Chien et al.
2019/0206812 A1* 7/2019 Bonifield ................ H01L 24/85

* cited by examiner

*Primary Examiner* — Marc Anthony Armand
(74) *Attorney, Agent, or Firm* — Ronald O. Neerings; Frank D. Cimino

(57) ABSTRACT

An electronic device includes a bond wire with a first end bonded by a ball bond to a planar side of a first conductive plate, and a second end bonded by a stitch bond to a conductive stud bump at an angle greater than or equal to 60 degrees. A wirebonding method includes bonding the first end of the conductive bond wire to the first conductive plate includes forming a ball bond to join the first end of the conductive bond wire to a planar side of the first conductive plate by a ball bond, and bonding the second end of the conductive bond wire to the conductive stud bump includes forming a stitch bond to join the second end of the conductive bond wire to the conductive stud bump.

20 Claims, 33 Drawing Sheets

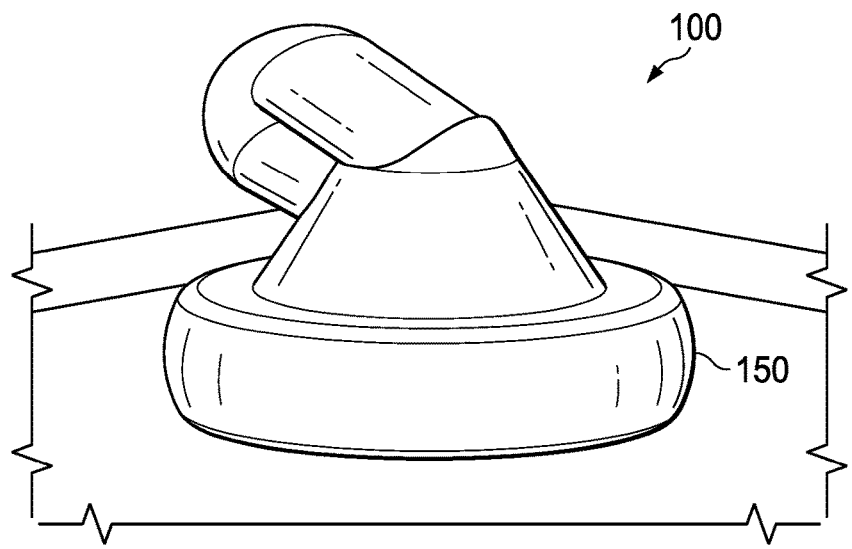
FIG. 1D
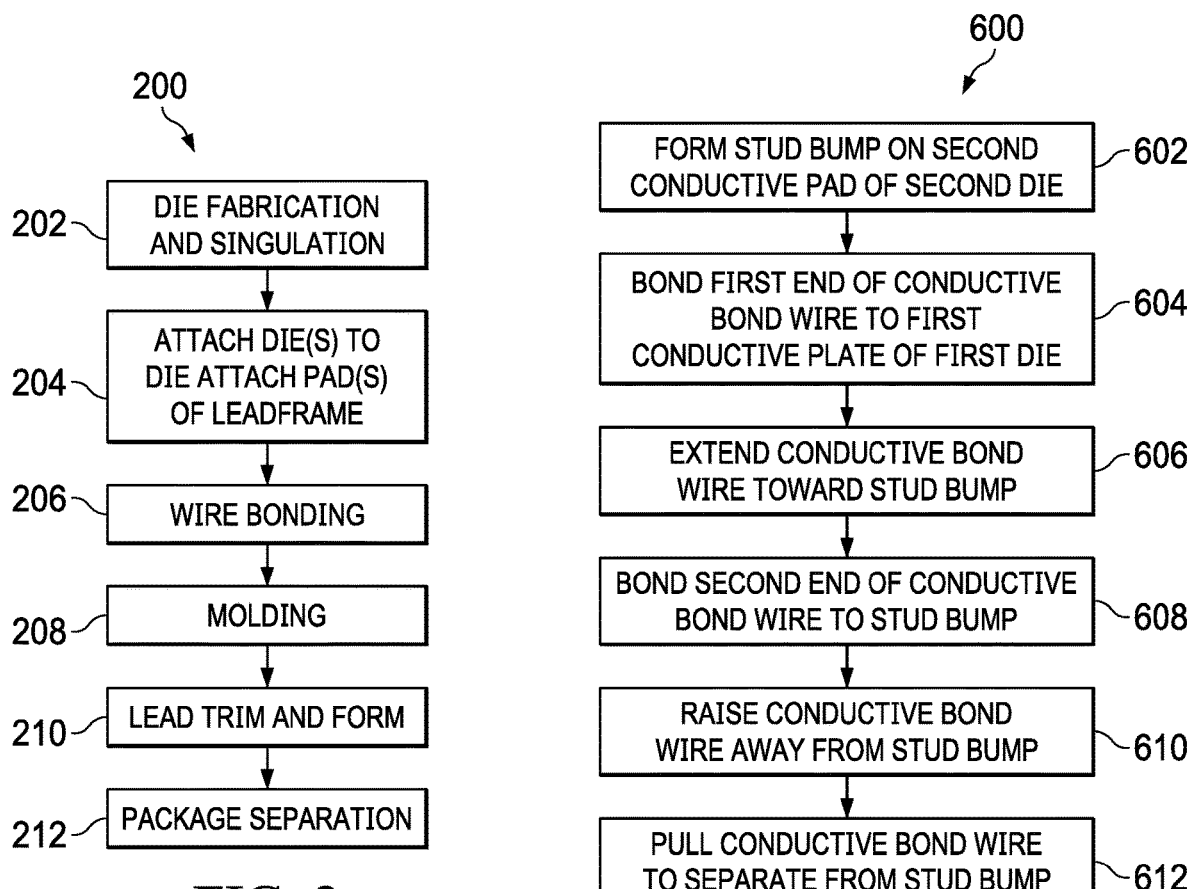
FIG. 2
FIG. 6

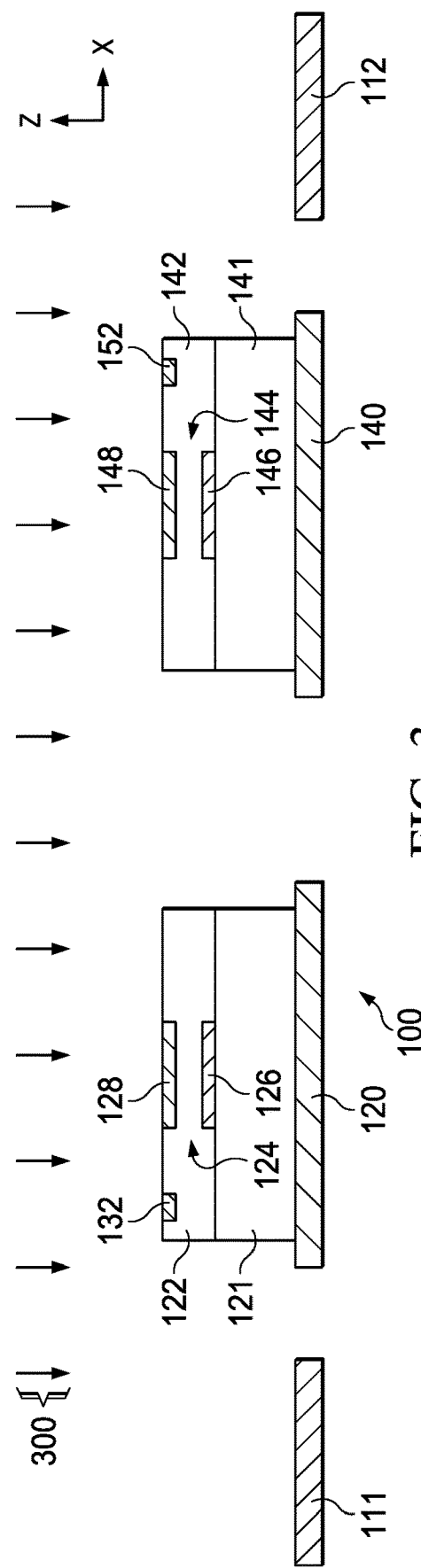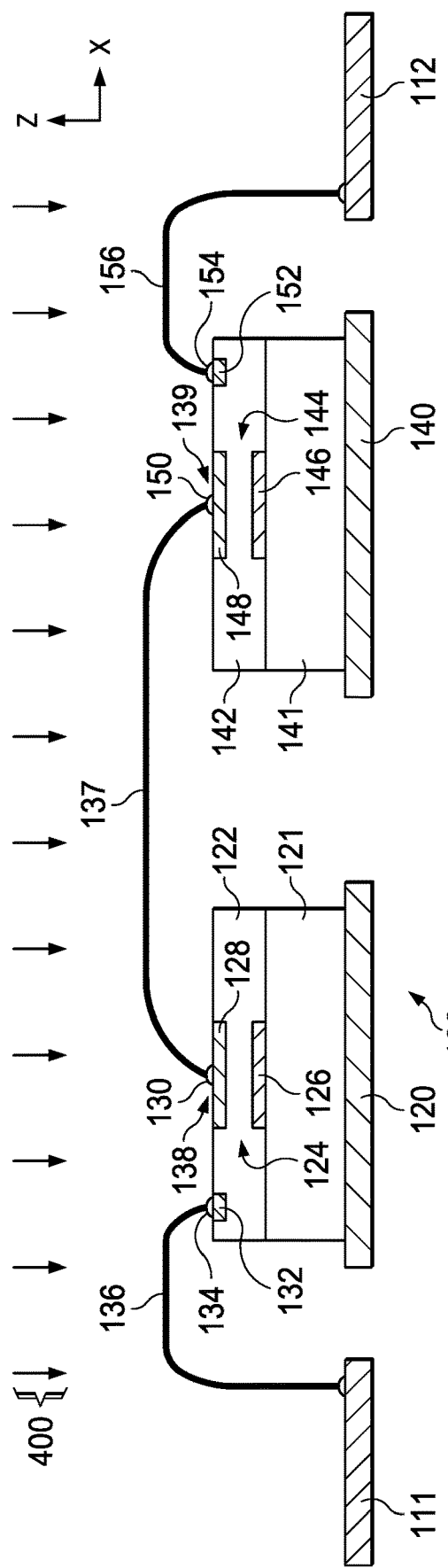

STUD BUMP FOR WIREBONDING HIGH VOLTAGE ISOLATION BARRIER CONNECTION

BACKGROUND

High voltage isolation barriers are used in electronic power converter and communications devices, to transfer power or signaling between different voltage domains. Close spacing between high voltage isolation barrier components can lead to undesirable dielectric breakdown or arcing. Wirebonding capacitor plates of different voltage domains presents problems in avoiding arcing, particularly for low profile devices with short loop height restrictions. Insufficient wire stitch angle in a wire bond connection can induce an electrical breakdown and arcing issue for high voltage isolation.

SUMMARY

In one aspect, a packaged electronic device includes first and second semiconductor dies with respective plates coupled by a conductive bond wire, and the second plate has a conductive stud bump. The bond wire has a first end bonded to a planar side of the first conductive plate. The second end of the conductive bond wire is bonded to the conductive stud bump at an angle greater than or equal to 60 degrees to a planar side of the second conductive plate.

In another aspect, a method of manufacturing a packaged electronic device includes fabricating a first semiconductor die having a first conductive plate, fabricating a second semiconductor die having a second conductive plate, attaching the first semiconductor die to a first die attach pad and attaching the second semiconductor die to a second die attach pad. The method further includes forming a conductive stud bump extending outward from a planar side of the second conductive plate, bonding a first end of a conductive bond wire to the first conductive plate, as well as bonding a second end of the conductive bond wire to the conductive stud bump at an angle of 60 degrees or more to a plane of a planar side of the second conductive plate and forming a package structure to enclose the first semiconductor die, the second semiconductor die, the conductive stud bump and the conductive bond wire.

In a further aspect, a wirebonding method includes forming a conductive stud bump on a planar side of a second conductive plate, forming a ball bond that joins a first end of a conductive bond wire to a first conductive plate and forming a stitch bond that joins a second end of the conductive bond wire to the conductive stud bump using a wire bonding tool.

BRIEF DESCRIPTION OF THE DRAWINGS

FIG. 1D is a partial perspective view of an elevated stud bump in the packaged electronic device of FIG. 1.

FIG. 2 is a flow diagram of a method of manufacturing a packaged electronic device.

FIGS. 3-5 are sectional side elevation views of the packaged electronic device of FIG. 1 undergoing fabrication processing according to the method of FIG. 2.

FIG. 6 is a flow diagram of a wire bonding process.

DETAILED DESCRIPTION

Figure 1:
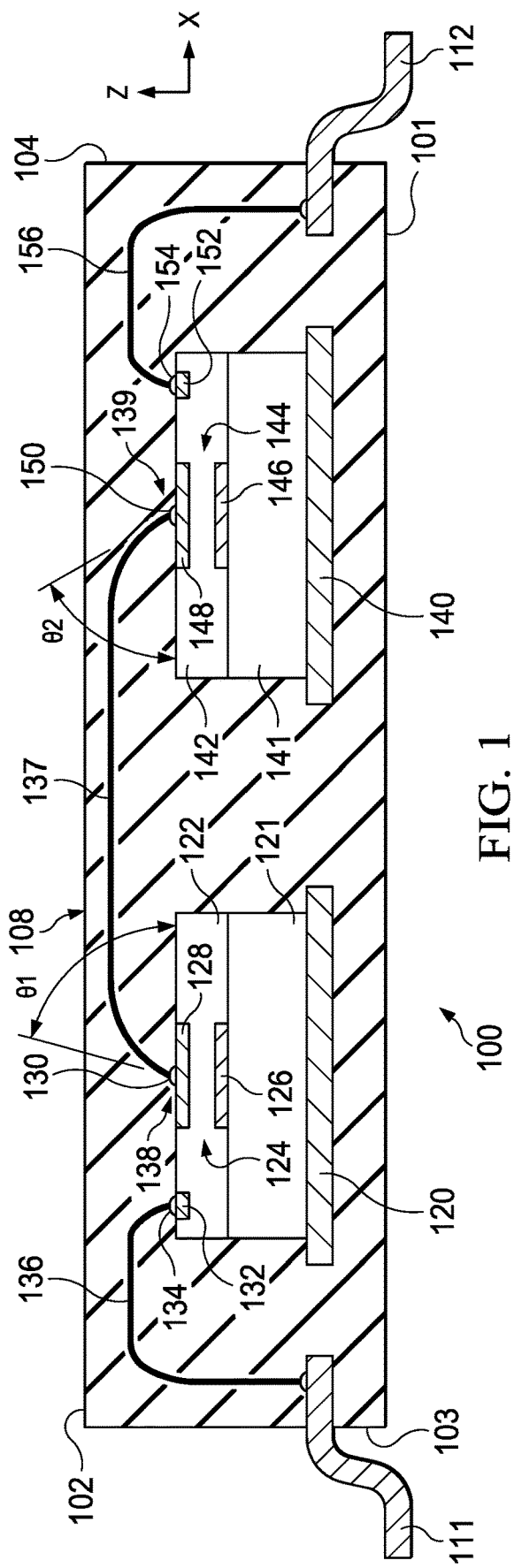
FIG. 1 is a sectional side elevation view of a packaged electronic device with a bond wire connecting capacitor plates with elevated stud bumps.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
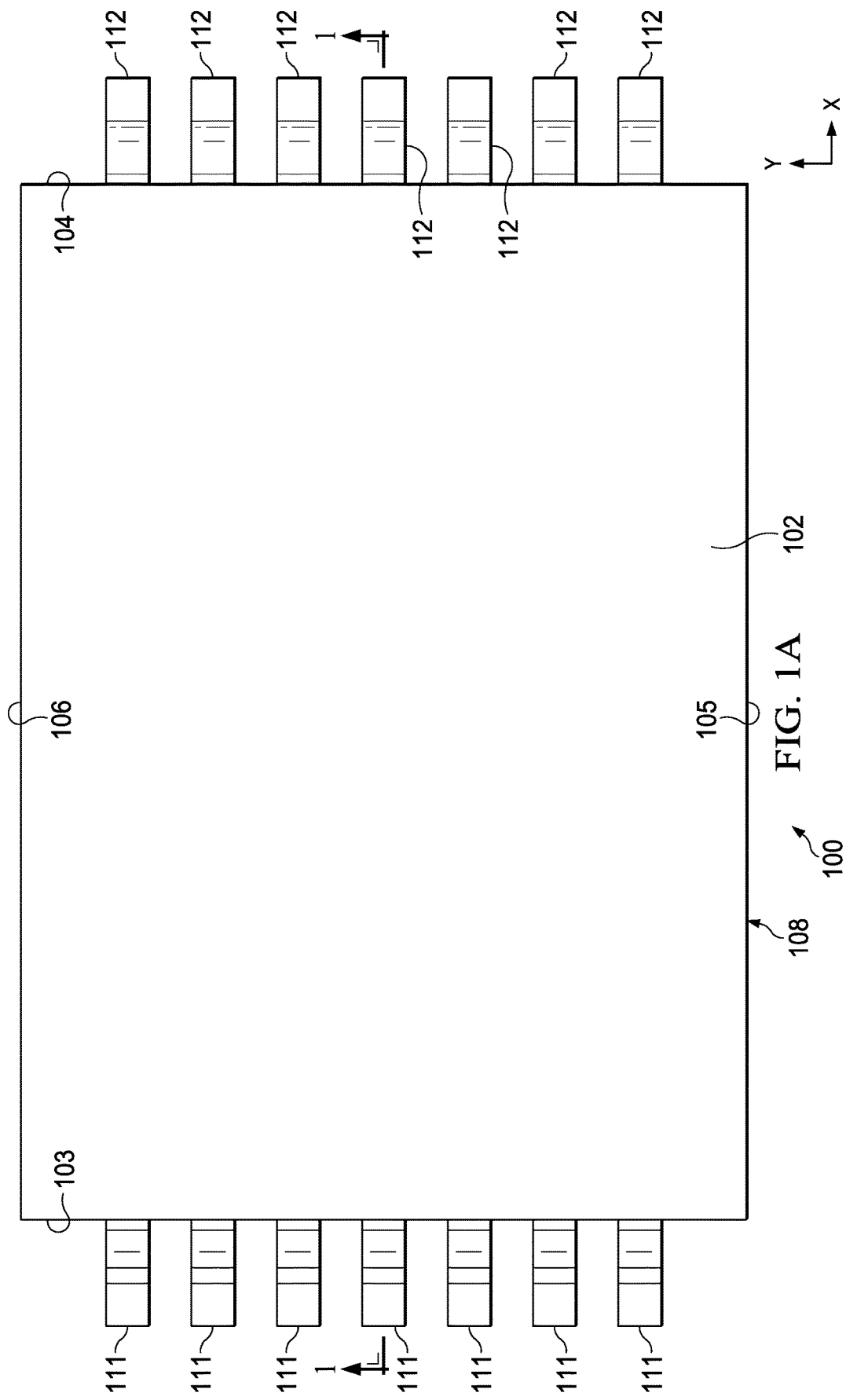
FIG. 1A is a top plan view of the packaged electronic device of FIG. 1.
Figure 1B:
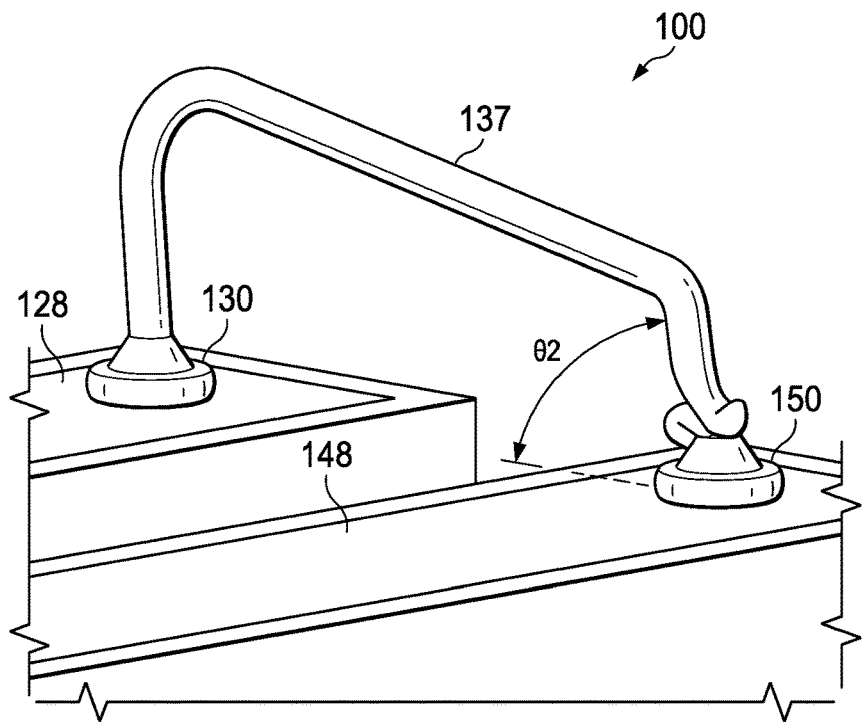
FIG. 1B is a partial perspective view of an example of the bond wire connection in the packaged electronic device of FIG. 1.
Figure 1C:
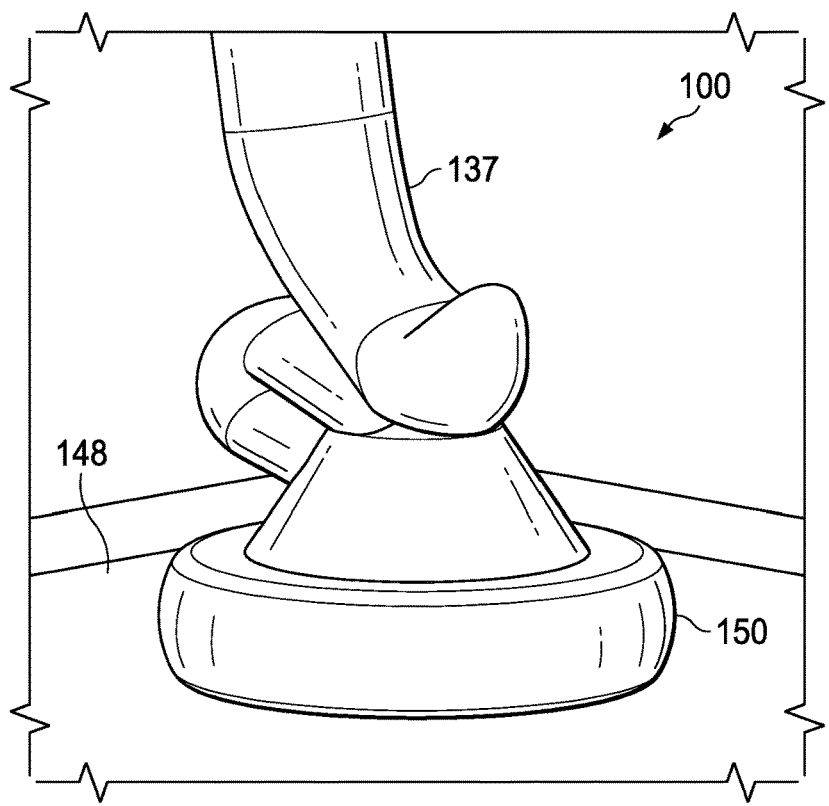
FIG. 1C is a partial perspective view of one connection of a bond wire to an elevated stud bump in the packaged electronic device of FIG. 1.
Figure 1E:
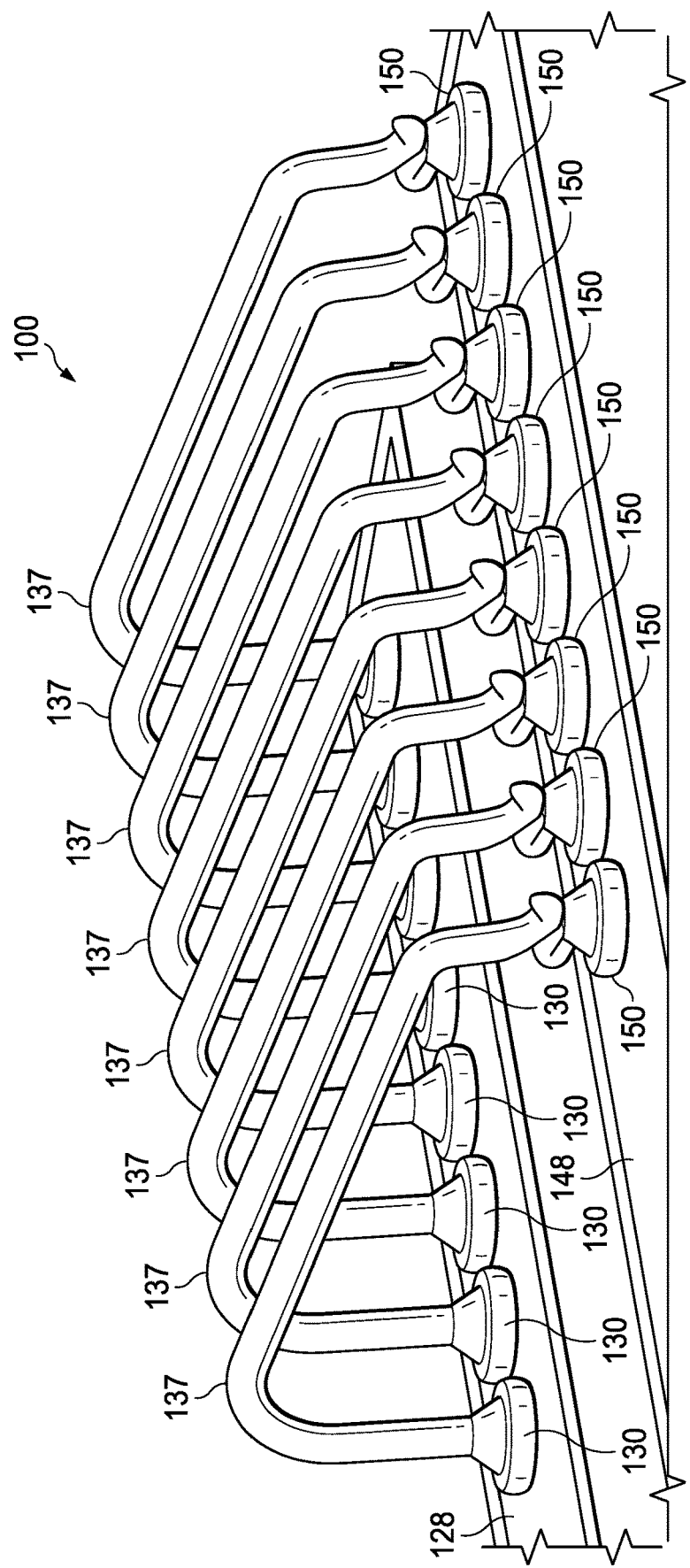
FIG. 1E is a partial perspective view of several bond wires connected to respective elevated stud bumps in the packaged electronic device of FIG. 1.

FIGS. 1A-1D show a packaged electronic device 100 with a bond wire connecting capacitor plates using elevated stud bumps. FIG. 1 shows a sectional side view along section line 1-1 in the top view of FIG. 1A. FIG. 1B shows an example of a bond wire connection and FIG. 1C shows one connection of a bond wire to half or less of an elevated stud bump, referred to as an "Atlas Stud bump", in the packaged electronic device 100. FIG. 1D shows an example elevated stud bump and FIG. 1E shows several bond wires connected to respective elevated stud bumps in the packaged electronic device 100.

The packaged electronic device 100 includes a package structure 108 with a first side 101 (e.g., the bottom side in the illustrated orientation of FIG. 1) and an opposite second side 102 (e.g., top) spaced apart from the first side 101 along a first direction (e.g., the vertical direction Z in FIGS. 1 and 1B). The packaged electronic device 100 also includes a third side 103 (e.g., the lateral left side in FIGS. 1, 1A and 1B) and an opposite fourth side 104 (e.g., right side) spaced apart from the third side 103 along a second direction (e.g., the X direction), where the second direction X is orthogonal to the first direction Z. The packaged electronic device 100 in the illustrated example is generally rectangular and includes lateral ends formed by a fifth side 105 and a sixth side 106 (FIG. 1A). The sixth side 106 is spaced apart from the fifth side 105 along a third direction Y that is orthogonal to the respective first and second directions Z and X. The packaged electronic device 100 in this example has generally flat or planar bottom and top sides 101 and 102. The lateral sides 103-106 can be tapered from a mold parting line to facilitate ejection from a mold during fabrication. In other implementations, one or more of the lateral sides 103-106 can be flat or planar and/or one or both sides 101 and 102 can be non-planar. The packaged electronic device 100 has a set of gull wing first leads 111 that extend outward and down from the third side 103, and a set of gull wing second leads 112 that extend outward and down from the fourth side 104.

As best shown in the sectional view of FIG. 1, the packaged electronic device 100 includes a first conductive die attach pad 120, with a first semiconductor die 121, 122 mounted thereon. The first semiconductor die includes a semiconductor portion 121 and a metallization structure 122 on a top side of the semiconductor portion 121. The first semiconductor die 121, 122 includes a first capacitor 124 having a lower capacitor plate 126 and an upper or first capacitor plate 128 separated or spaced apart from one another by a dielectric material of the first metallization structure 122. The first conductive plate 128 has a planar top side with a connection 130. The metallization structure 122 of the first semiconductor die 121, 122 in this example also includes a bond pad 132 having an exposed upper side with a bond wire connection 134 that connects to a bond wire 136, which electrically couples the bond pad 132 to the first lead 111.

A conductive bond wire 137 includes a first end 138 that is bonded to the planar top side of the first conductive plate 128 by the connection 130. The conductive bond wire 137 also includes a second end 139. The first end 138 of the conductive bond wire 137 is joined to the first conductive plate 128 at a first angle θ1 to a plane of the planar side of the first conductive plate 128. In one example, the first angle θ1 is greater than or equal to 60 degrees and may be as much as 90 degrees in certain examples. In one example, the connection 130 is a ball bond formed by a wire bonding tool as described further below.

The packaged electronic device 100 in FIG. 1 also has a second die attach pad 140 with a second semiconductor die 141, 142 thereon. The second semiconductor die includes a semiconductor portion 141 and a metallization structure 142 on a top side of the semiconductor portion 141. The second semiconductor die 141, 142 includes a second capacitor 144 with a lower capacitor plate 146 and an upper or second conductive plate 148 separated or spaced apart from one another by a dielectric material of the metallization structure 142. A conductive stud bump 150 is bonded to, and extends outward from, a planar side of the second conductive plate 148. The metallization structure 142 includes a bond pad 152 with an exposed upper side having a bond wire connection 154 that connects to another bond wire 156 to electrically couple the bond pad 152 to the second lead 112. The package structure 108 encloses the first semiconductor die 121, 122, the second semiconductor die 141, 142, the conductive stud bump 150 and the conductive bond wires 136, 137 and 156, as well as interior portions of the leads 111 and 112.

The second end 139 of the conductive bond wire 137 bonded to the conductive stud bump 150. The second end 139 is joined to the conductive stud bump 150 at a second angle θ2 to the plane of the planar side of the second conductive plate 148. In one example, the second end 139 of the conductive bond wire 137 is bonded to the conductive stud bump 150 by a stitch bond using the wire bonding tool. In one example, the second angle θ2 is greater than or equal to 60 degrees. In one implementation, the second angle θ2 is less than or equal to 75 degrees. In another example, the second angle θ2 is less than or equal to 70 degrees. In one implementation, the stitch bond of the second end 139 joins half or less of the conductive stud bump 150 to further facilitate an increased second angle θ2 with respect to the plane of the top side of the second conductive plate 148.

The bond wire joint angles θ1 and θ2 are each above 60 degrees, whereas conventional wire bonding structures and techniques typically achieve 30 to 40 degrees, particularly for stich bonds. The increase bond wire joint angles θ1 and θ2 are advantageous for bonding to electrical components, such as the capacitors 124 and 144 where the components are coupled at a high voltage isolation boundary. In one example, the first semiconductor die 121, 122 operates in a first voltage domain when the packaged electronic device 100 is powered and operating, whereas the second semiconductor die 141, 142 operates in a different second voltage domain. The respective capacitors 124 and 144 are coupled in series with one another in this example to transfer signals across an isolation barrier, in which the voltage of the conductive bond wire 137, and hence the voltage of the upper conductive plates 128 and 148 can tens or even hundreds of volts above or below the respective voltages of the lower capacitor plates 126 and 146. The increased bond wire joint angles θ1 and θ2 increases the spacing between the lower capacitor plates 126 and 146 and the conductive bond wire 137. The increased spacing mitigates dielectric breakdown and/or arcing while allowing increased voltage difference between the first and second voltage domains along with thin overall package dimensions without increasing loop height of the bond wire 137. In addition, the conductive stud bump 150, the connection 130 and the bond wire 137 can be fabricated using a single wire bonding tool during wire bond processing in one example, without significant increase in manufacturing cost or complexity, even for various loop height and wire length implementations.

Figure 5:
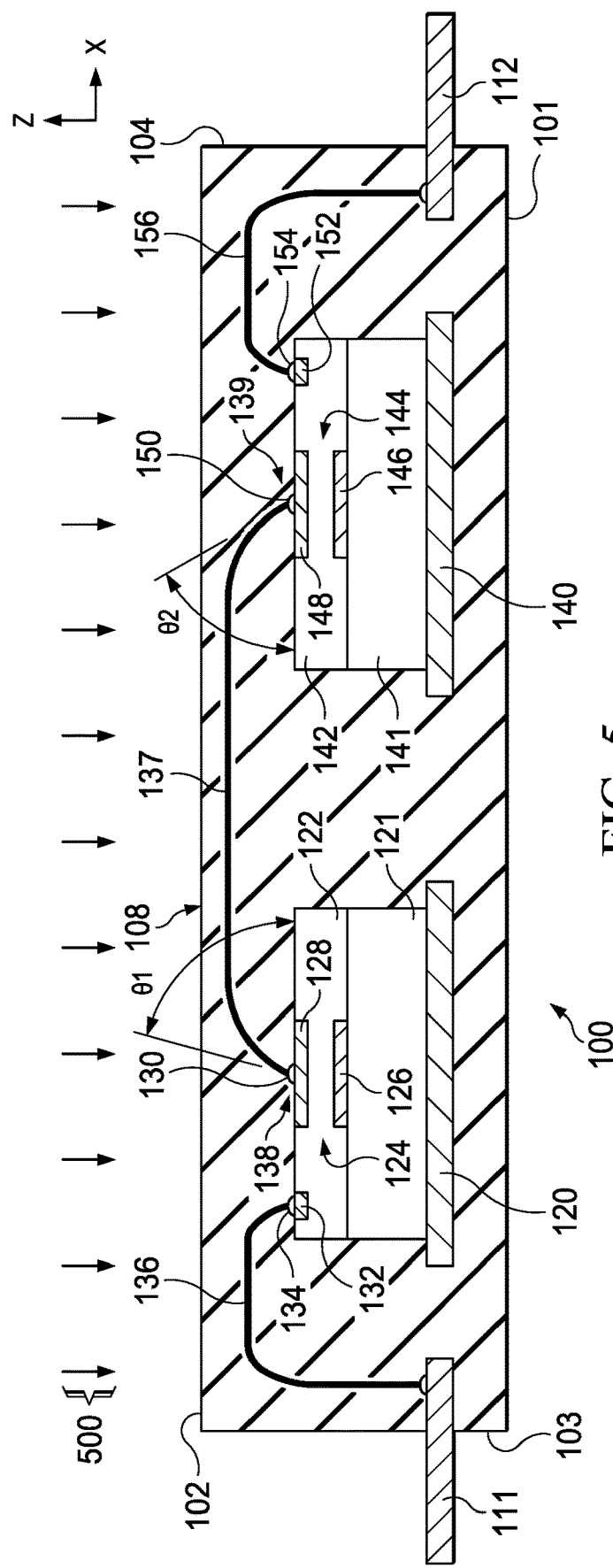

Referring now to FIGS. 2-5, FIG. 2 shows a method 200 of fabricating a packaged electronic device and FIGS. 3-5 show side views of the packaged electronic device 100 undergoing fabrication processing according to the method 200. In one example, the semiconductor device fabrication uses standard processing steps with a modified wirebonding process to form die to die and die to lead electrical connections before forming a package structure. The method 200 begins in FIG. 2 with die fabrication and die singulation at 202, for example, to produce the first semiconductor die 121, 122 having the first conductive plate 128 and the first bond pad 132, and the second semiconductor die 141, 142 having the second conductive plate 148 as shown in FIG. 1 above.

The method 200 continues with die attach processing at 204. FIG. 3 one example in which a die attach process 300 is performed that attaches the first semiconductor die 121, 122 to the first die attach pad 120 and attaches the second semiconductor die 141, 142 to the second die attach pad 140 of a starting lead frame that also includes unbent leads 111 and 112. The die attach process 300 can use any suitable adhesive attachment materials and steps, such as adhesive epoxy, soldering, etc. In one example, the starting lead frame includes an array with multiple sections that respectively correspond to a finished electronic device, and multiple sections may be processed concurrently. The lead frame including the unbent leads 111 and 112 and the die attach pads 120 and 140 initially constitutes a unitary copper structure formed by suitable stamping operations, which may include features at different levels or on a single level as in the illustrated example. In one example, the starting lead frame includes one or more support arms (not shown) that support the die attach pads 120 and 140. Such support arm or arms can be connected to portions of the lead frame to support the die attach pads 120 and 140 during and after manufacturing or can be removed during manufacturing. In another example, the die attach pads 120 and 140 are supported relative to the unbent lead portions 111 and 112 using an adhesive carrier or tape (not shown).

The method 200 continues at 206 in FIG. 2 with wire bonding. FIG. 4 shows one example where a wire bonding process 400 is performed that forms electrical connections by bond wires 136, 137 and 156. This example includes forming the first bond wire 136 coupled between the first lead 111 and the bond pad 132 of the first semiconductor die 121, 122, the bond wire 137 coupled between the conductive plates 128 and 148, and the bond wire 156 coupled between the second lead 112 and the bond pad 152 of the second semiconductor die 141, 142.

At 208, a molding operation is performed to form a package structure. FIG. 5 shows one example in which the packaged electronic device 100 undergoes a molding process 500 that forms the package structure 108 having the sides 101-106 shown and described above. The package structure 108 encloses the first semiconductor die 121, 122, the second semiconductor die 141, 142, the conductive stud bump 150, the conductive bond wires 136, 137 and 156 and portions of the leads 111 and 112.

In one example, the method 200 also includes lead trimming and forming as well as dam bar cutting at 210 to remove copper dam bar features between the lead locations of a repeating lead pitch pattern. During the molding at 208, the dam bar features (not shown) mitigate or prevent outflow of molding material, after which the dam bar features are removed at 210. The lead trimming in one example includes a lead cut process (not shown) that cuts ends of the leads 111 and 112 and leaves the generally flat unbent leads as shown in the front view of FIG. 5. In certain implementations, the method 200 also includes removal of any included tie bars at 210. The lead forming at 210 includes bending or otherwise forming external portions of the trimmed leads 111 and 112 into non-planar shapes, such as the gull wing forms shown in FIG. 1 above. The method 200 further includes package separation at 212 for example, by saw or laser cutting (not shown) and the resulting packaged electronic device 100 is shown in FIGS. 1 and 1A discussed above.

Referring now to FIGS. 6-32, FIG. 6 shows a wire bonding process 600 that can be used at 206 in FIG. 2 above, and FIGS. 7-32 show the packaged electronic device 100 of FIG. 1 undergoing wire bonding processing according to the method 600. The method 600 begins at 602 with forming a conductive stud bump on the conductive pad of a semiconductor die. FIGS. 7-23 show one example, in which the packaged electronic device 100 undergoes the wire bonding process 600 to form the conductive stud bump 150 that extends outward from the planar top side of the second conductive plate 148 of the second semiconductor die 141, 142. The conductive stud bump 150 in one implementation is formed using a wire bonding tool having a nozzle 700 for feeding a conductive wire 702 from a spool or other source (not show), along with a clamp 704 and an electronic flame source 706. The wire bonding tool 700, 704, 706 in this example is adapted for forming individual wire bonds with a starting ball bond and a finishing stitch bond by controlling the formation of a ball at the end of the wire 702 using the electronic flame source 706, controlling the position of the nozzle 700 in three-dimensional (X, Y, Z) space by three- or four-dimensional control and actuators (not shown), and controlling opening and closure of the clamp 704. The wire bonding tool 700, 704, 706 in one example has position control apparatus, such as actuators (not shown) that are configured to implement wedge bonding and to control the nozzle 700 for movement in four axes of movement (e.g., X, Y, Z and an angle). In one example, the wire bonding tool 700, 704, 706 is configured to use any suitable conductive wire 702, such as or including gold (Au), aluminum (Al), copper (Cu), etc.

Figure 7:
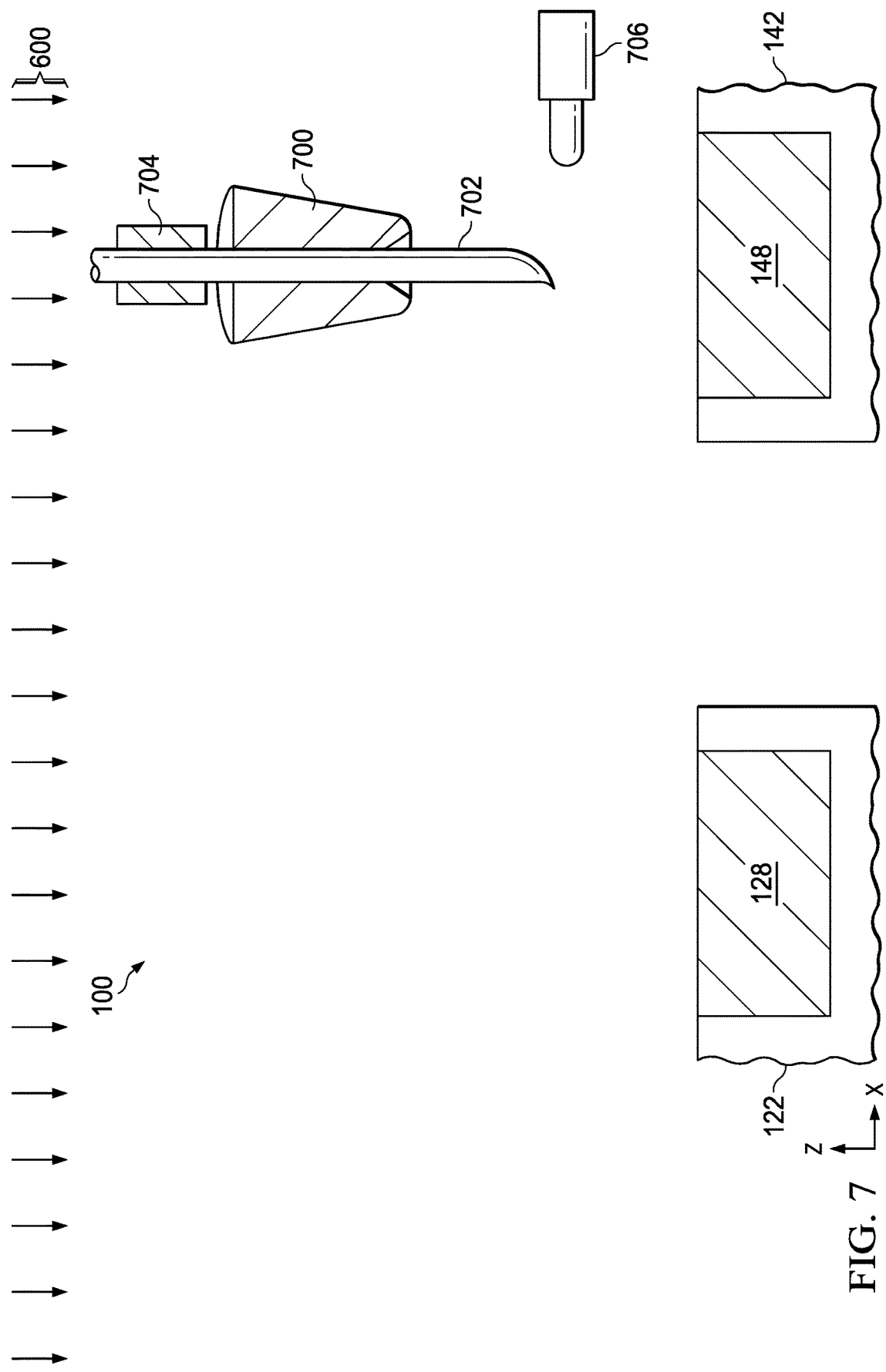
FIGS. 7-32 are partial side views of the packaged electronic device of FIG. 1 undergoing wire bonding processing according to the method of FIG. 6.
Figure 8:
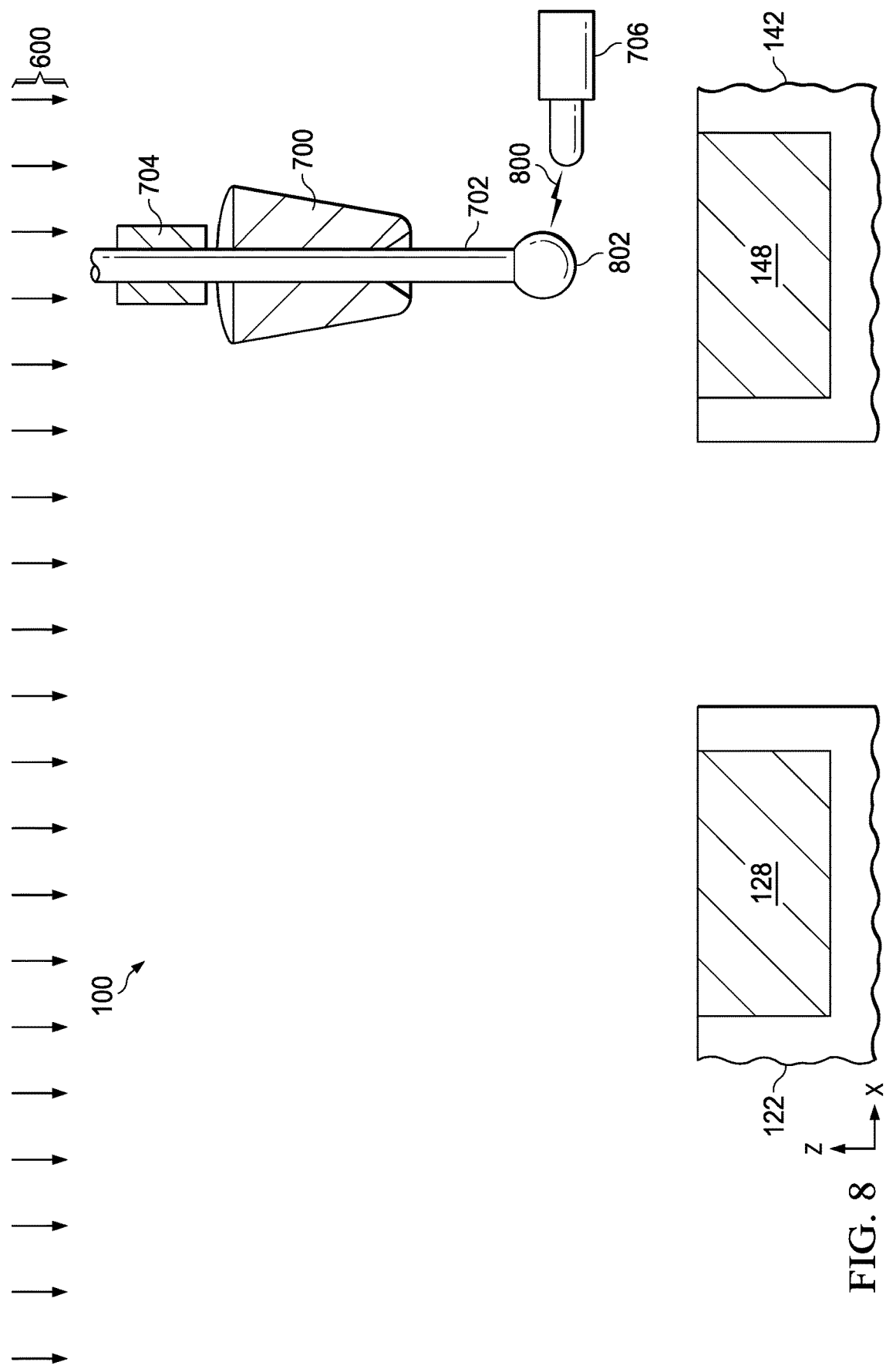
Figure 9:
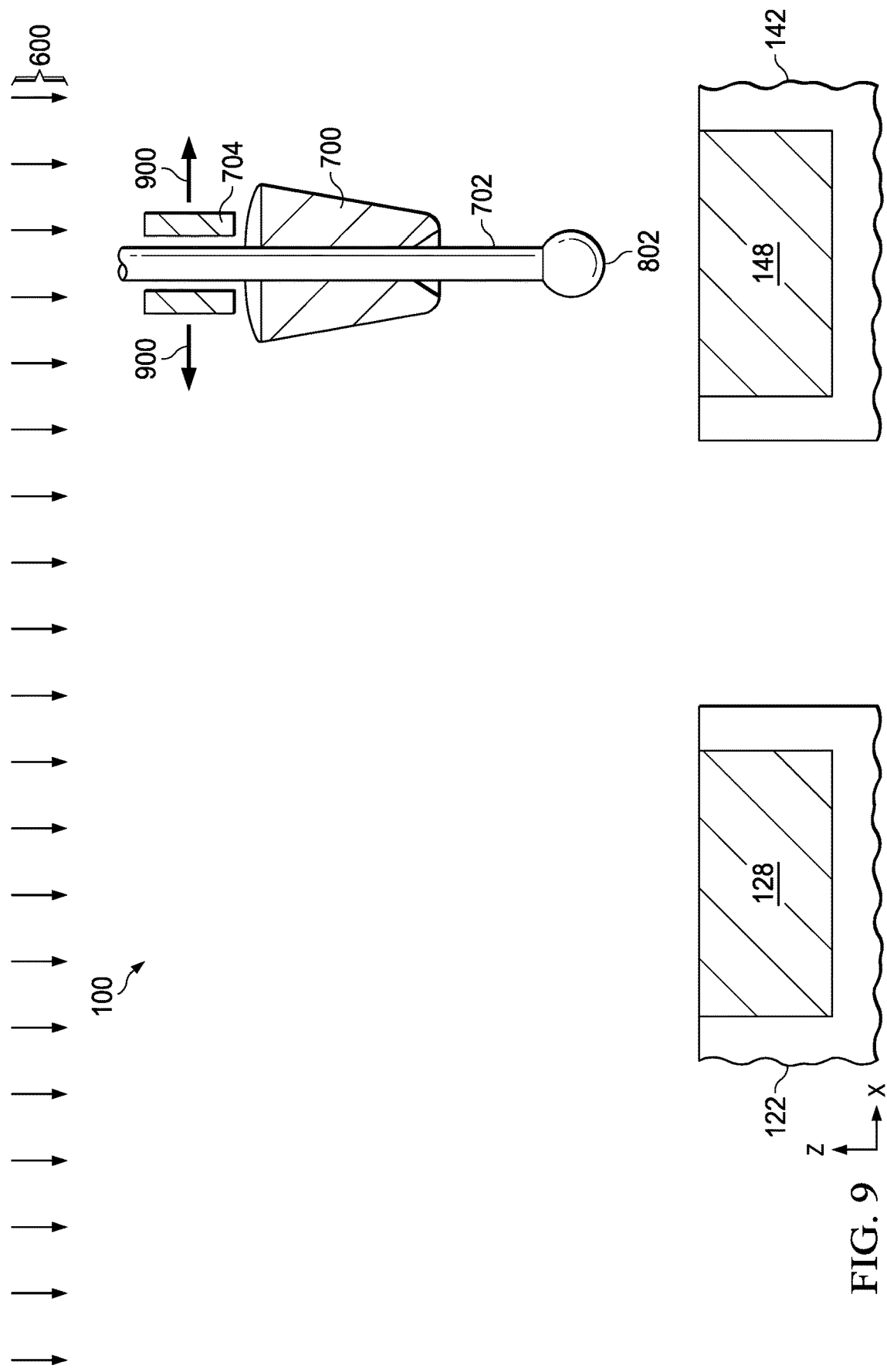
Figure 10:
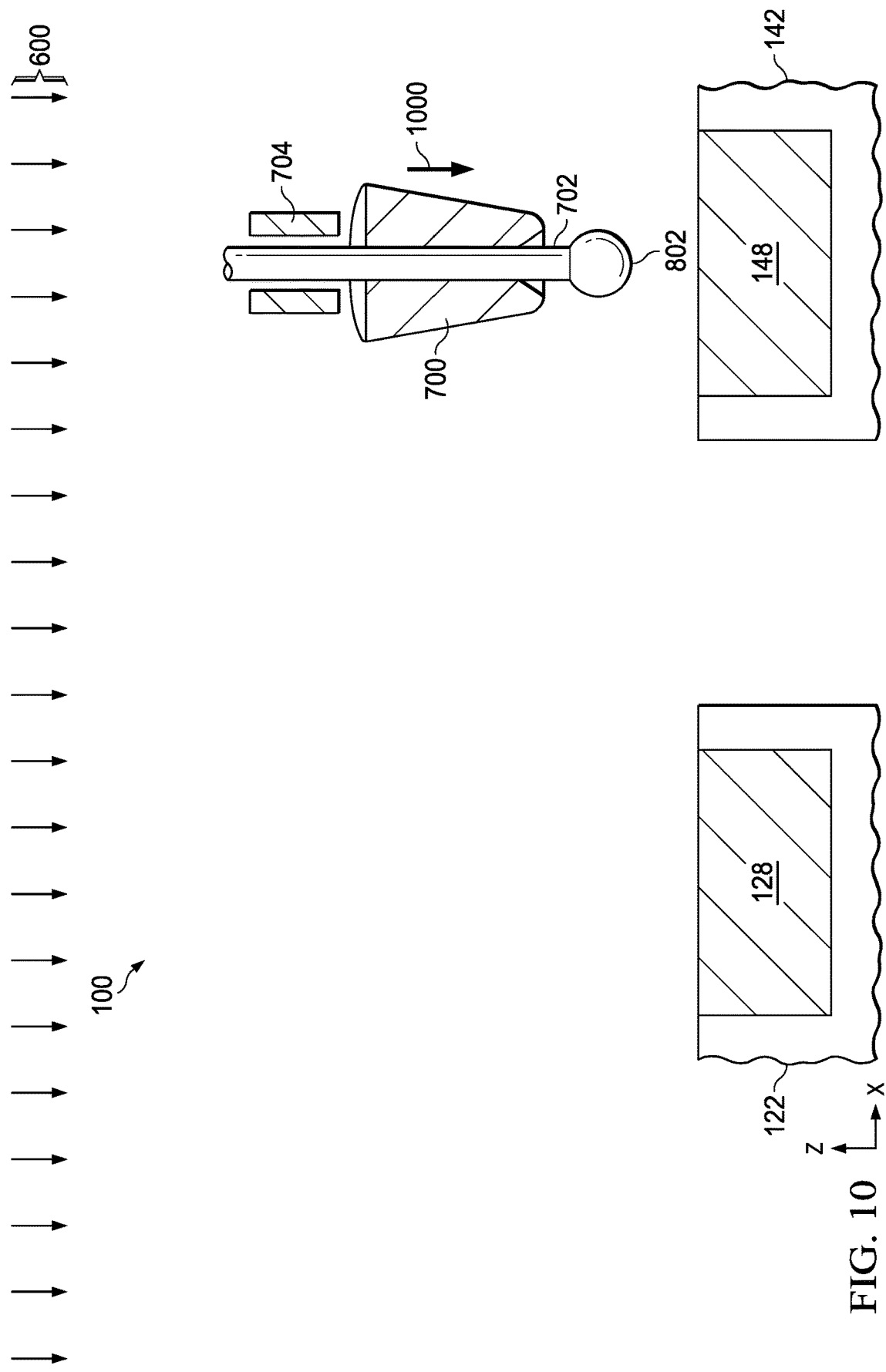
Figure 11:
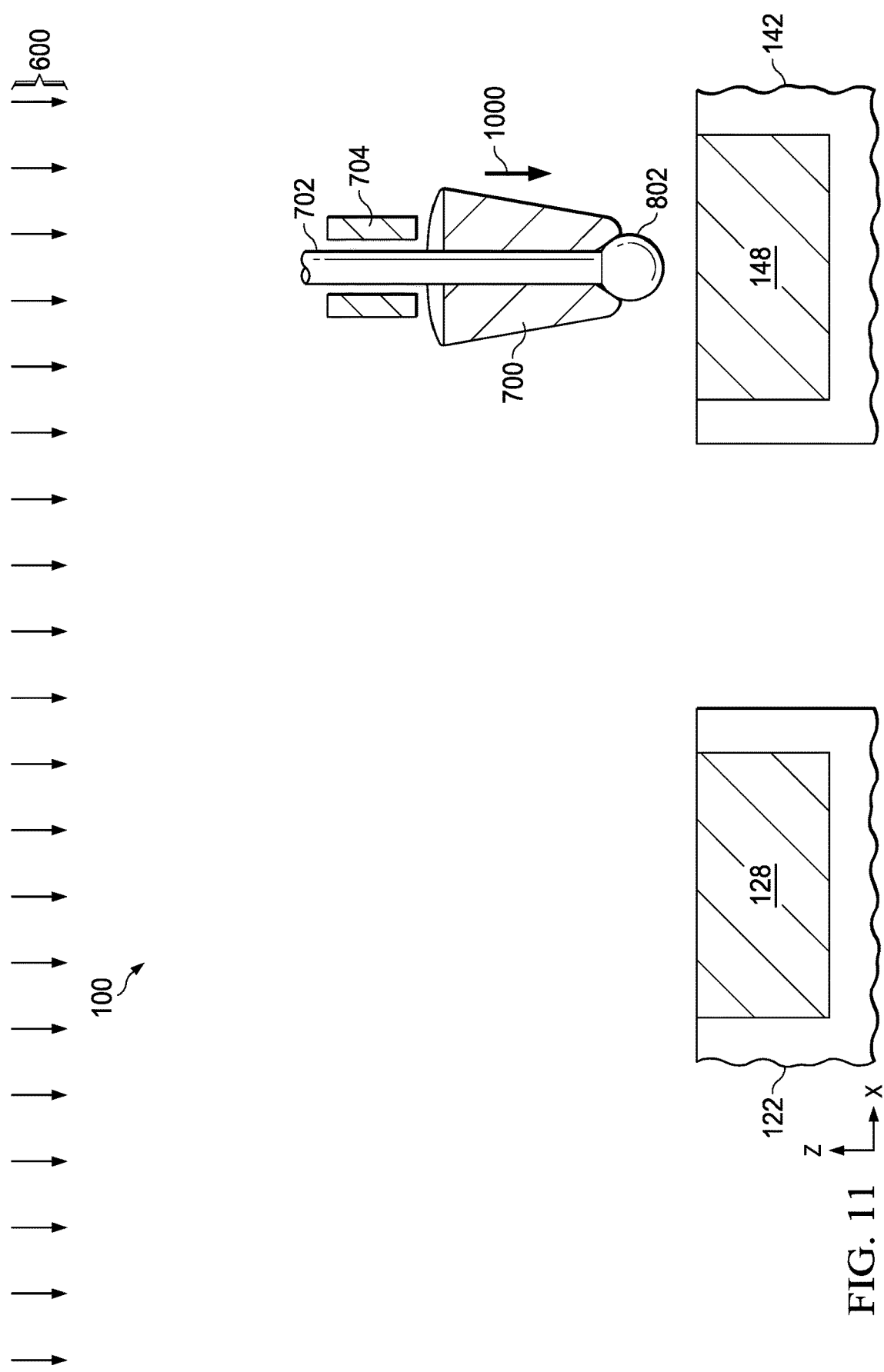
Figure 12:
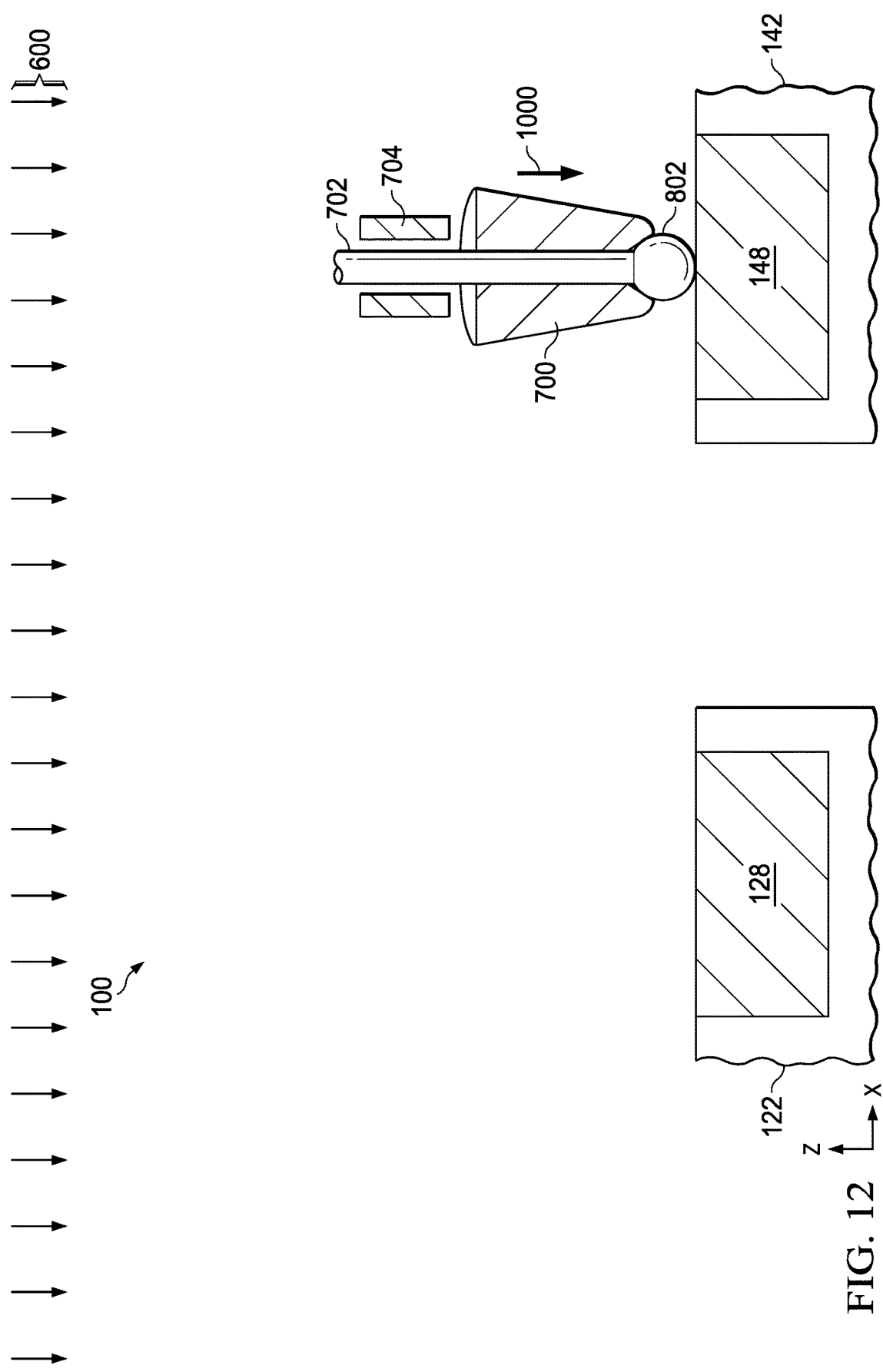
Figure 13:
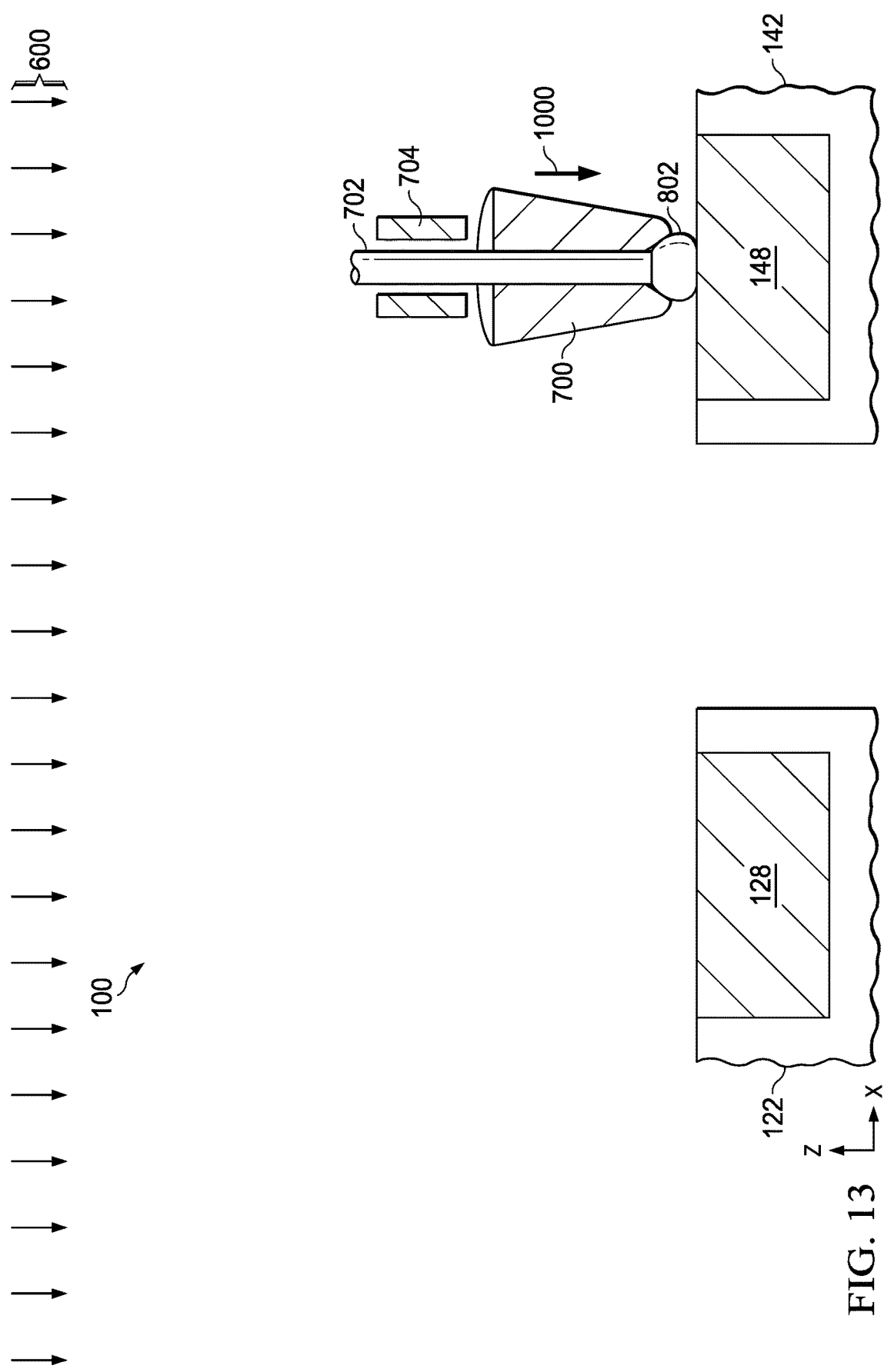
Figure 14:
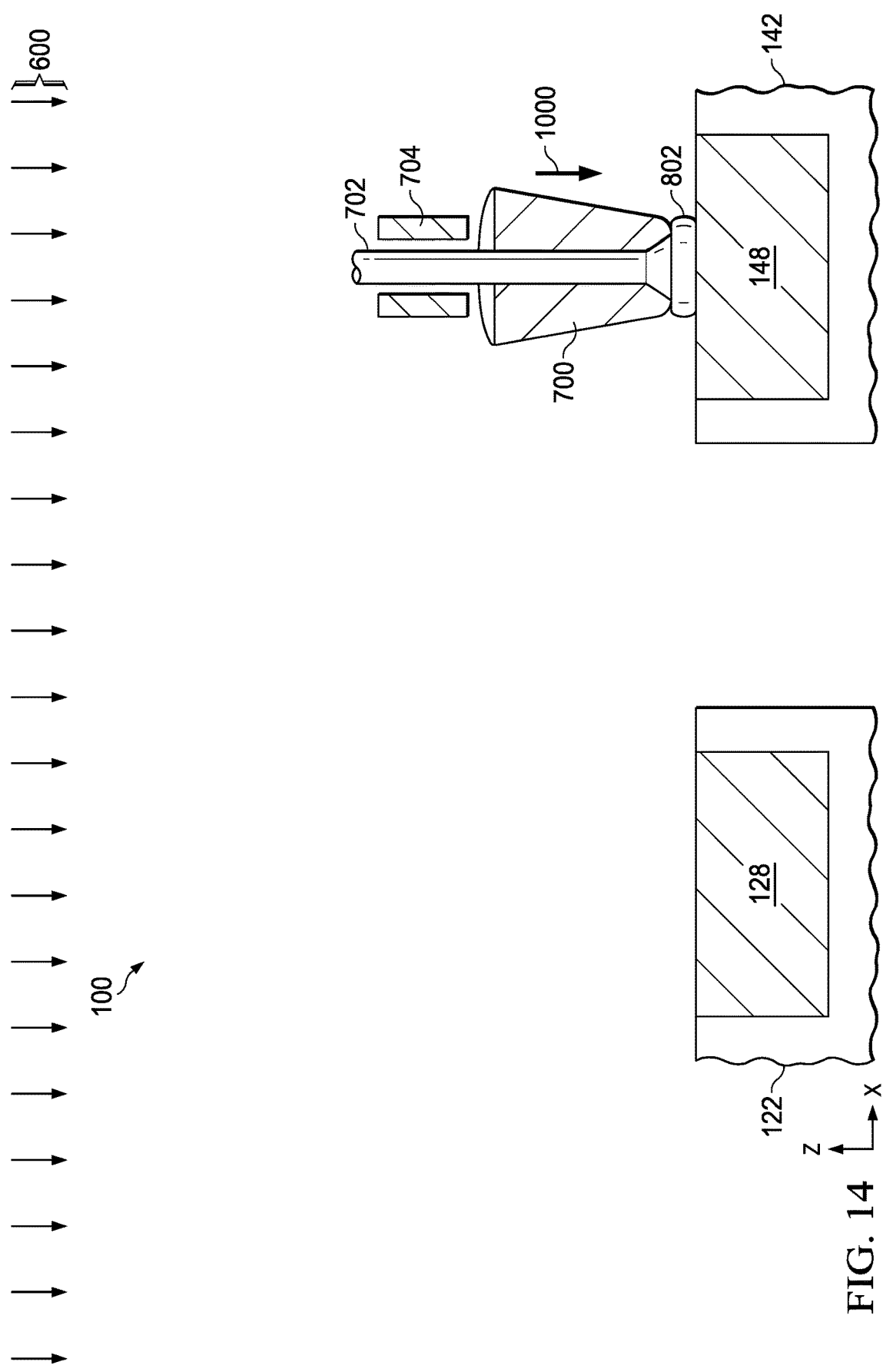

As shown in FIG. 7, the clamp 704 is initially closed to hold the wire 702, and the nozzle 700 is positioned close to the electronic flame source 706. In FIG. 8, an electronic flame off (EFO) process is implemented, in which the electronic flame source 706 is energized to form a flame or arc 800, which melts the end of the wire 702 to form a ball 802 suspended by the remainder of the wire 702 while the clamp 704 remains closed. The clamp 704 is then opened in FIG. 9, with the clamp halves separating along the directions of arrows 900, and the position control apparatus moves the nozzle 700 downward toward the planar top side of the second conductive plate 148 along the direction 1000 in FIGS. 10 and 11. The downward movement of the nozzle 700 continues with the ball 802 touching the top side of the second conductive plate 148 in FIG. 12 and progressively collapsing and laterally spreading in FIGS. 13 and 14 while the clamp 704 remains open.

Figure 15:
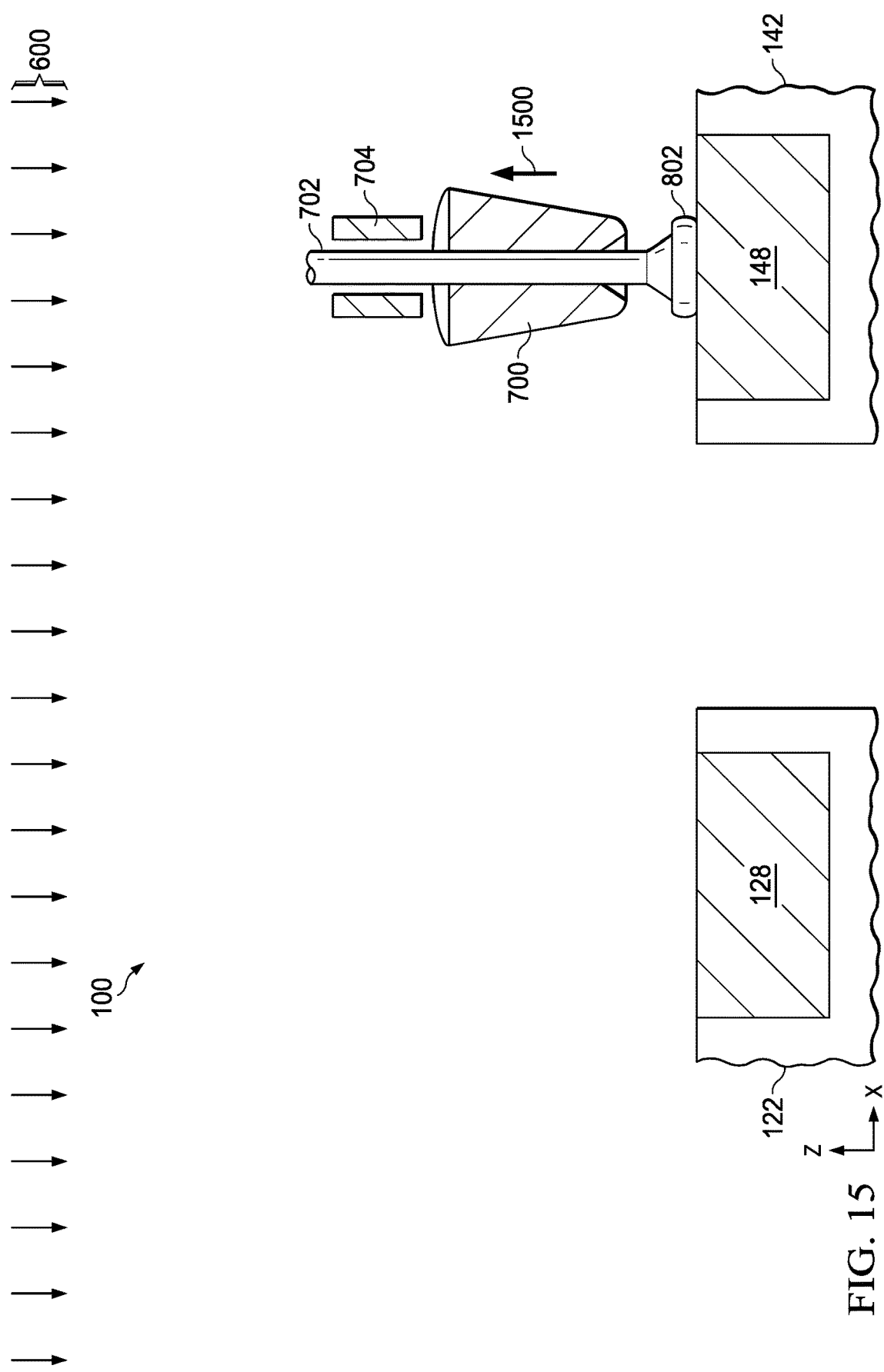
Figure 16:
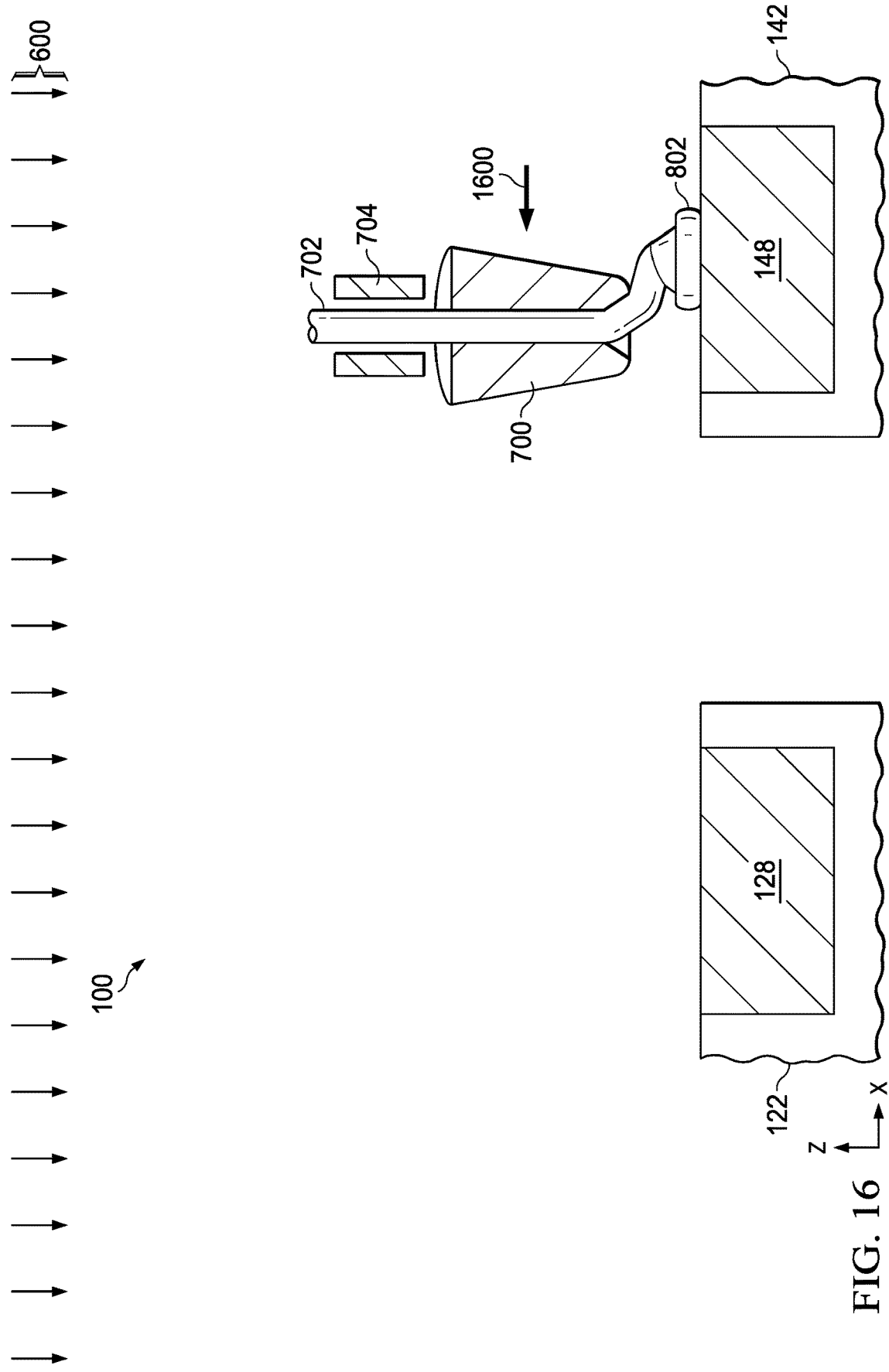
Figure 17:
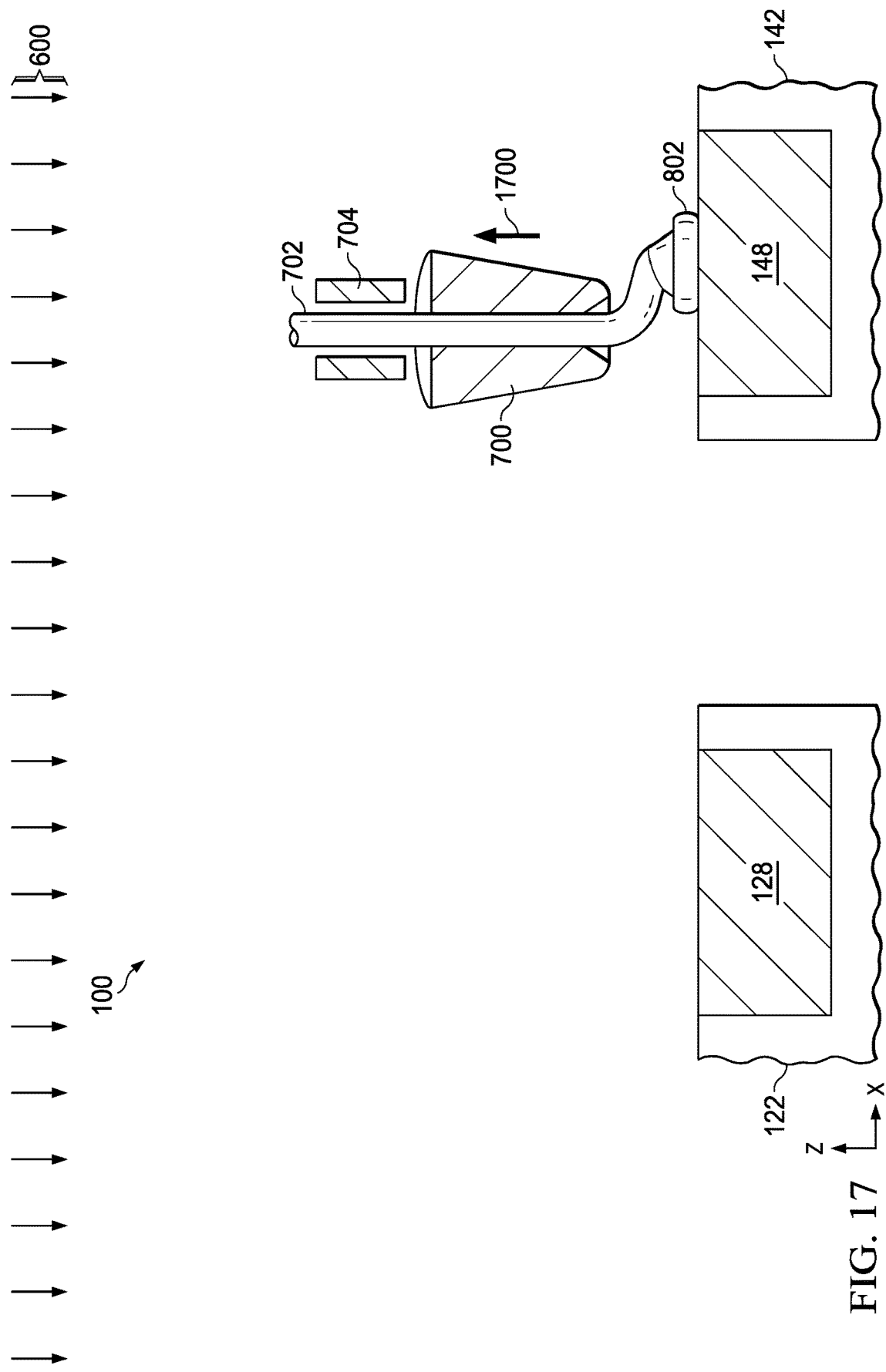
Figure 18:
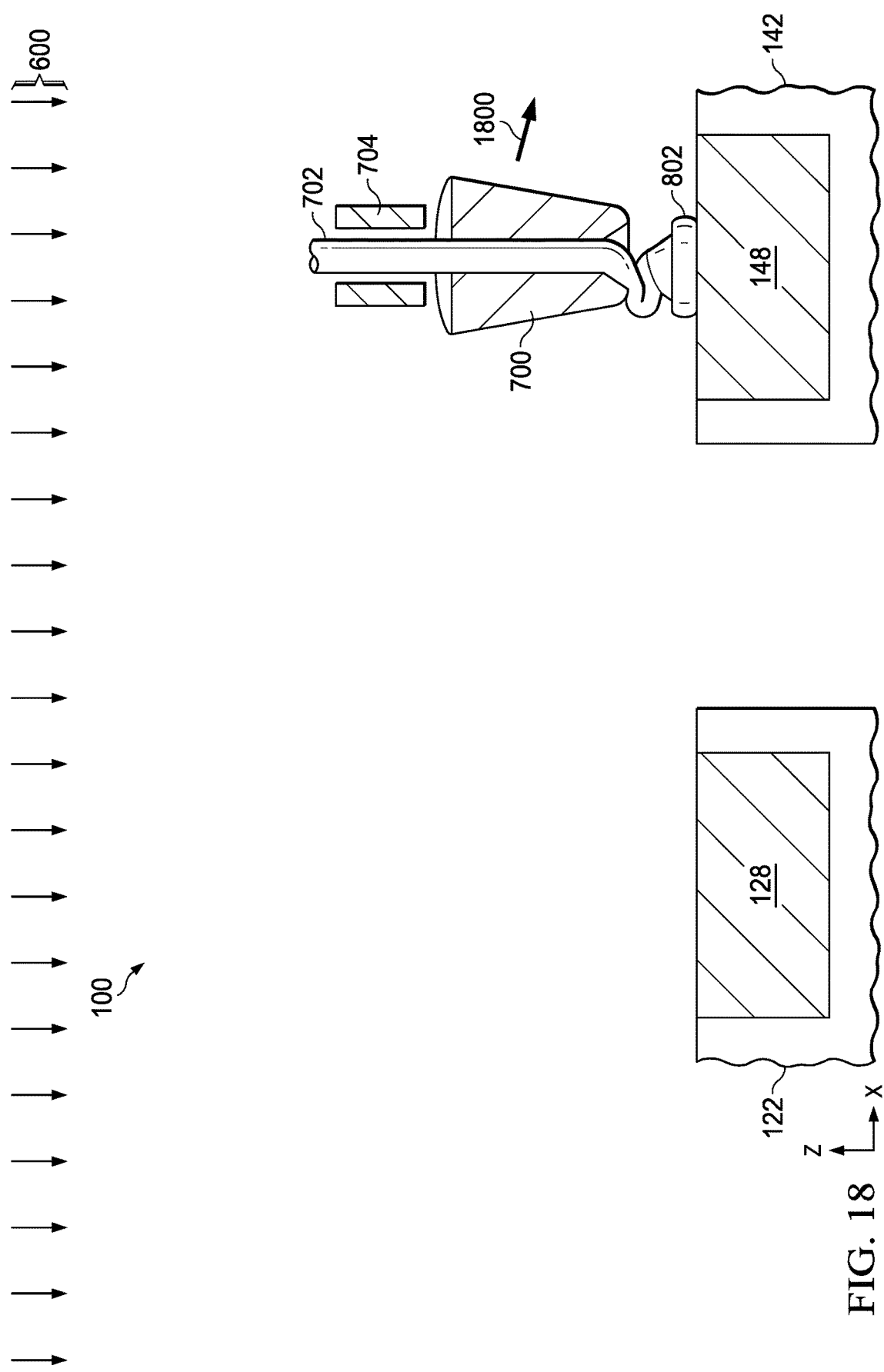
Figure 19:
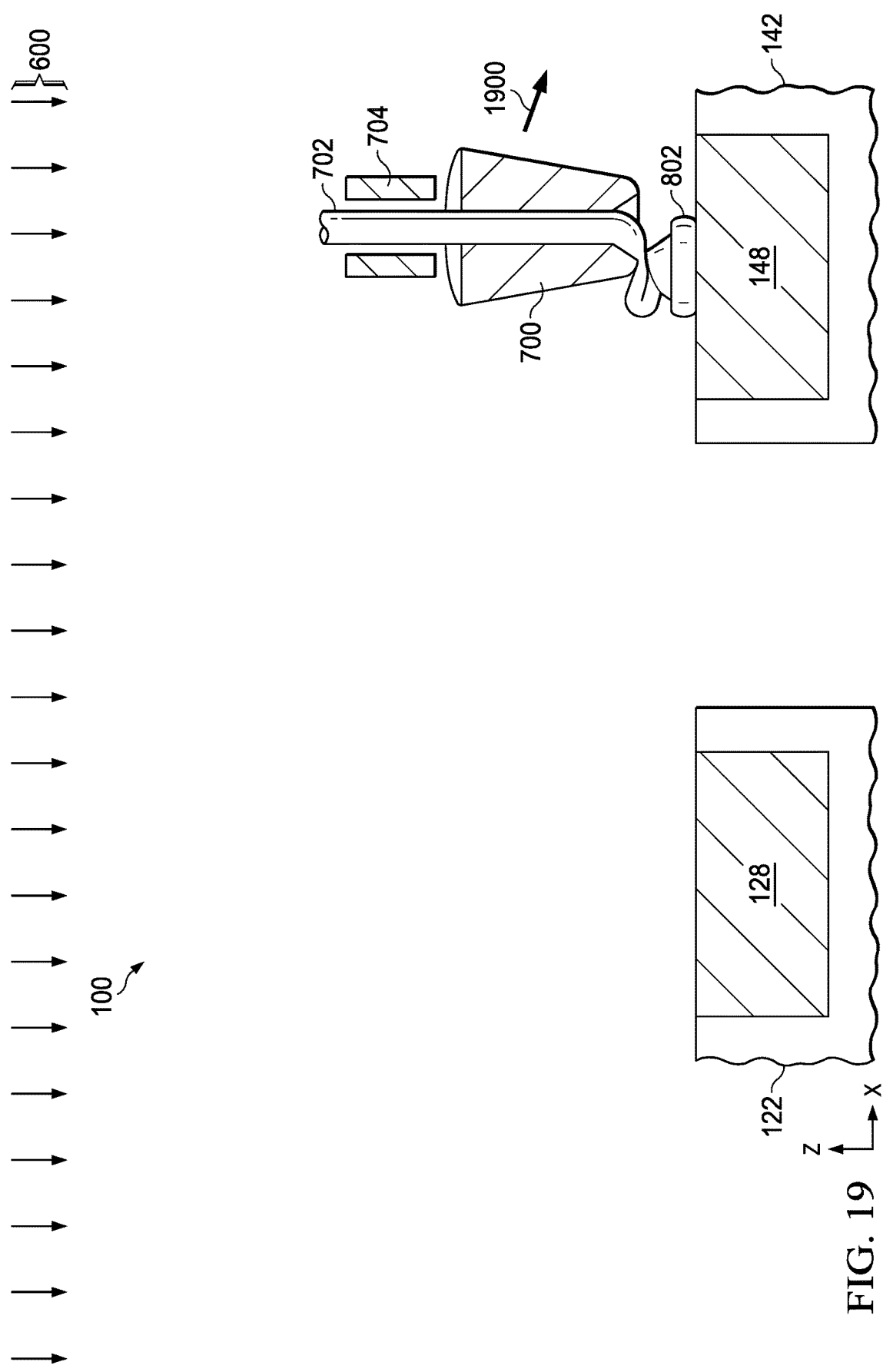
Figure 20:
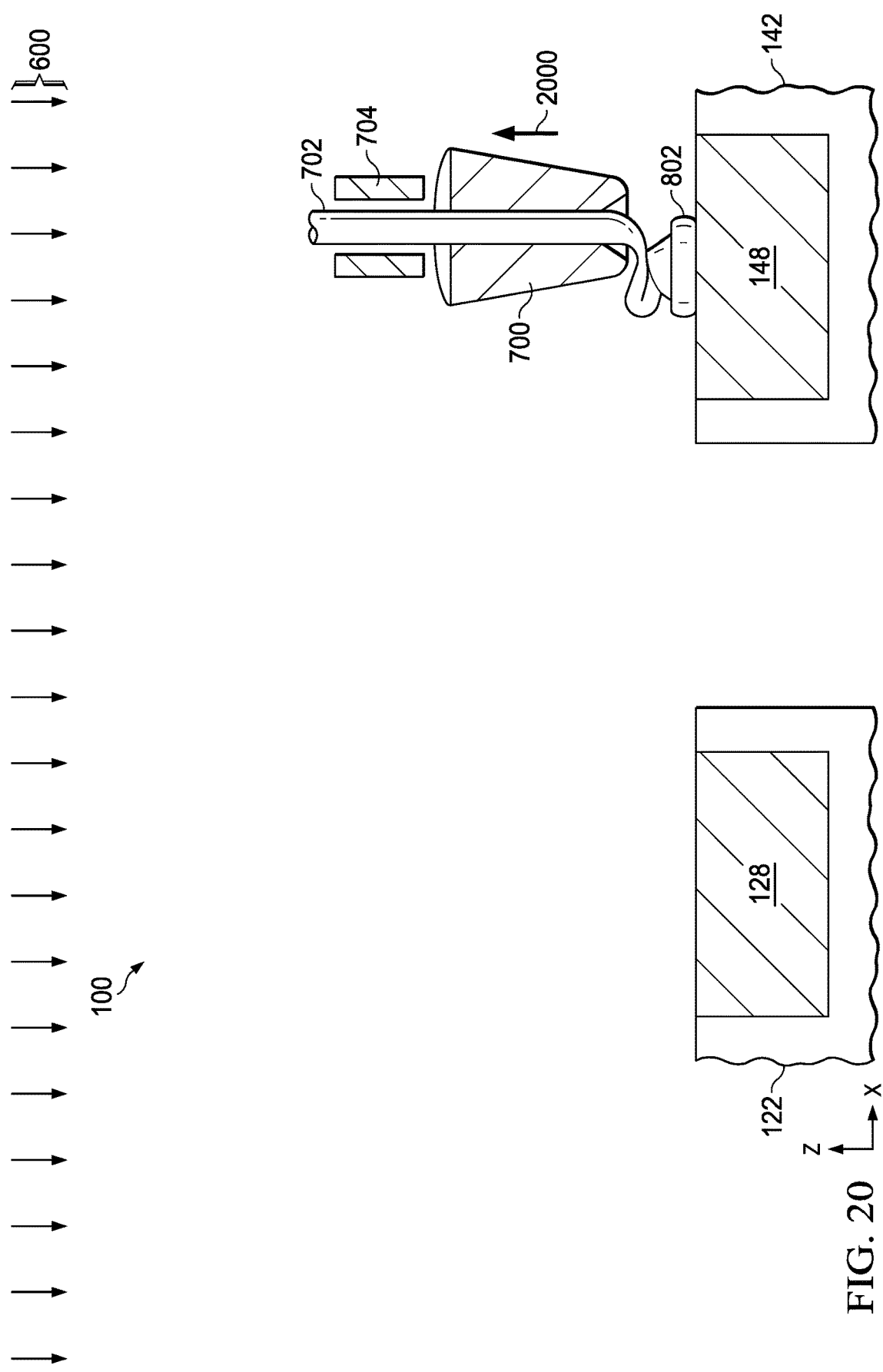
Figure 21:
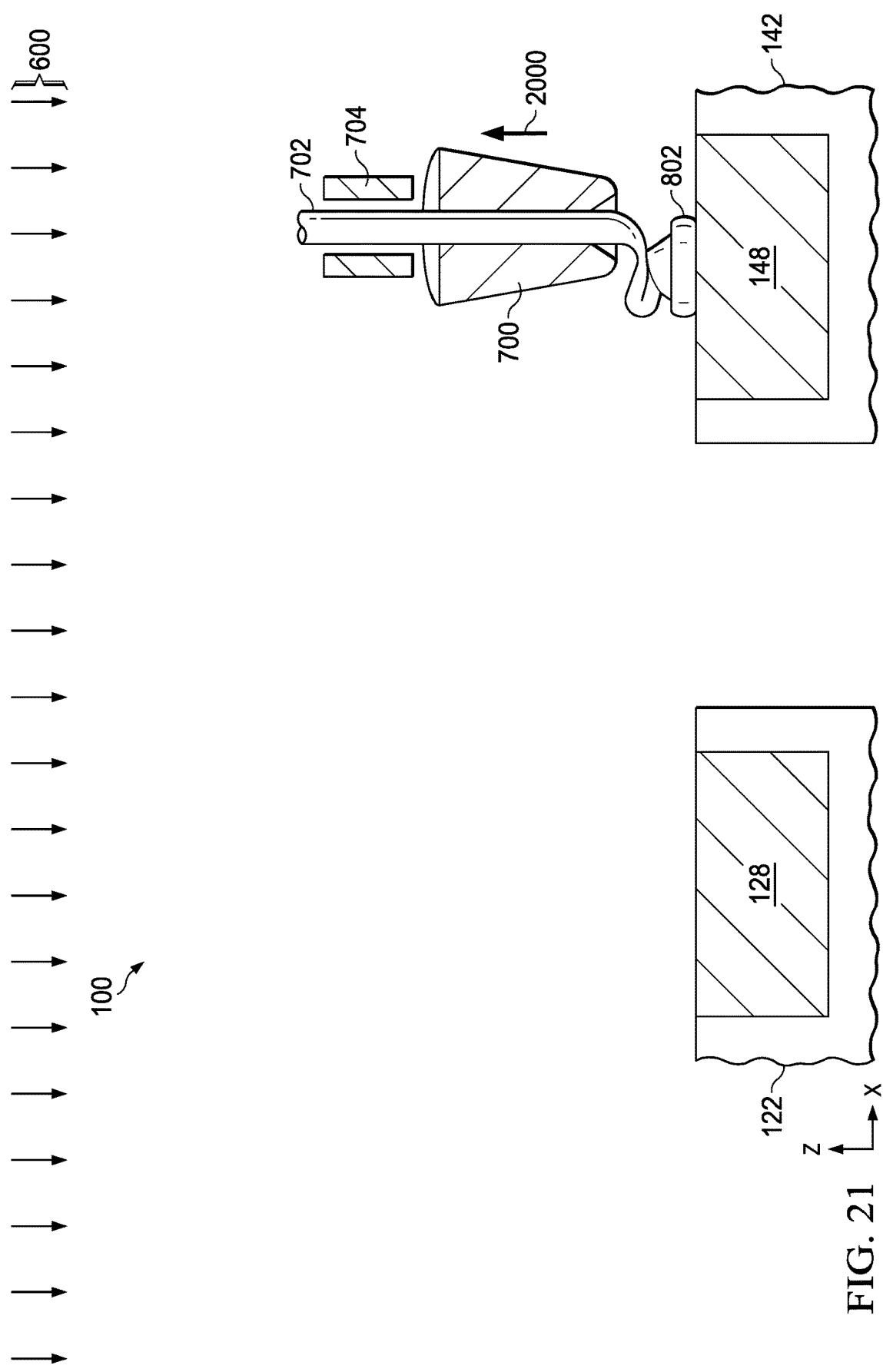
Figure 22:
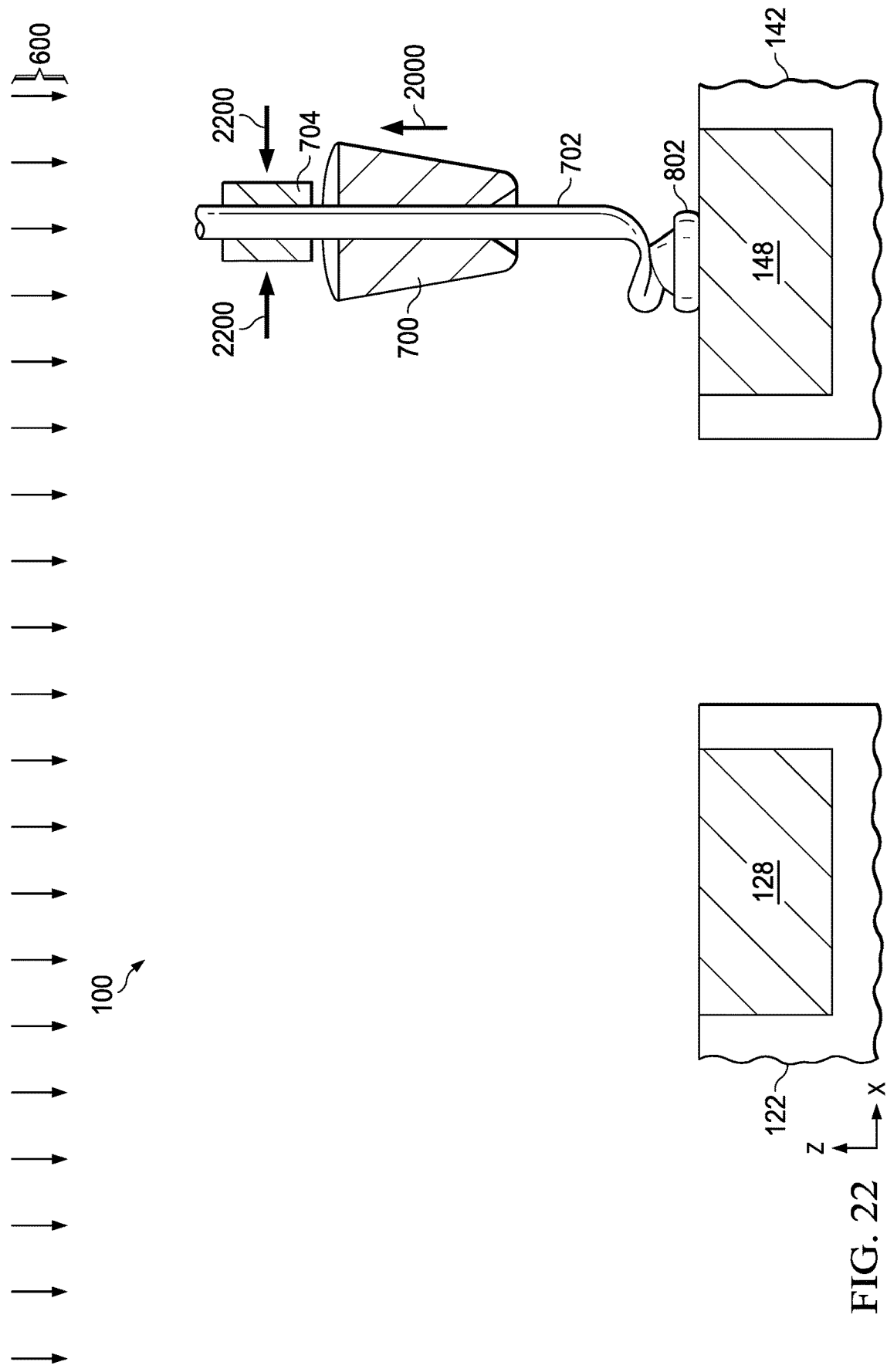
Figure 23:
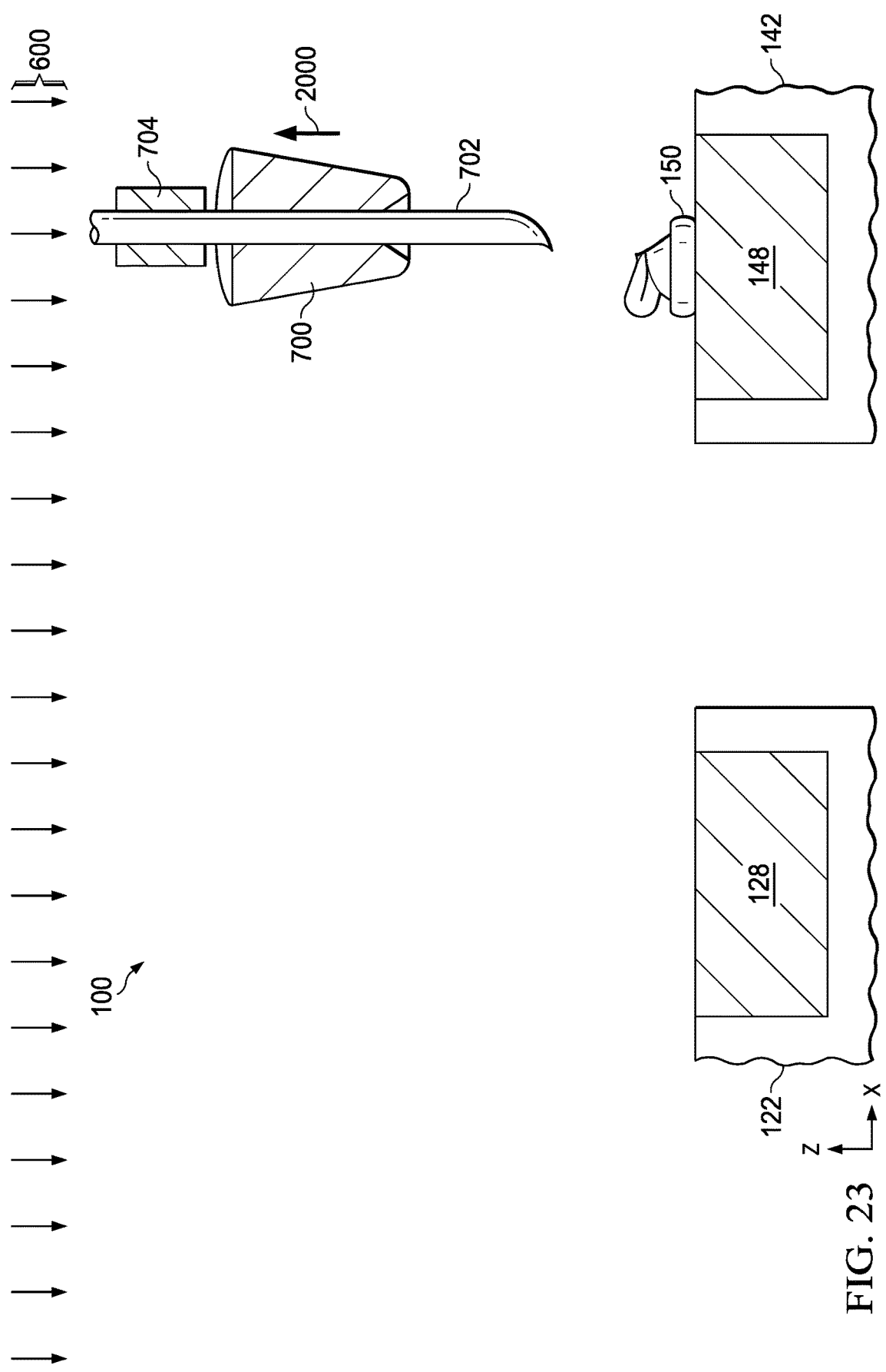

With the ball 802 formed on the planar top side of the second conductive plate 148 and the clamp 704 open, the position control apparatus moves the nozzle 700 upward along the direction 1500 in FIG. 15, and then laterally (e.g., to the left) along the direction 1600 in FIG. 16 to extend the wire 702 laterally outward of the collapsed ball 802. With the clamp 704 still open in FIG. 17, the position control apparatus moves the nozzle 700 upward along the direction 1700, and then laterally downward at an angle as shown by the direction arrow 1800 in FIG. 18, followed by further downward lateral movement along the direction of arrow 1900 in FIG. 19 while the clamp 704 remains open to curve the stud bump with a bag shape. In FIGS. 20 and 21, the position control apparatus moves the nozzle 700 upward along the direction 200 with the clamp 704 open to extend the wire 702 upward. In FIG. 22, the clamp 704 is closed and the nozzle 700 continues to be raised along the upward direction 2000, and the continued movement along the direction 200 causes the wire 702 to break as shown in FIG. 23 to complete the formation of the tall or elevated conductive stud bump 150 that extends outward (e.g., upward) from the planar top side of the second conductive plate 148.

Referring again to FIG. 6 and to FIGS. 24-32, The wirebonding process 600 continues at 604-612 in FIG. 6 with formation of the conductive bond wire 137 via a wire bonding process 2400. This includes bonding the first end 138 of the conductive bond wire 137 to the first conductive plate 128 at 604 using the wire bonding tool 700, 704, 706. In one example, the first end 138 of the conductive bond wire 137 is bonded to the first conductive plate 128 by forming 604 a ball bond to join the first end 138 of the conductive bond wire 137 to a planar side of the first conductive plate 128. The conductive bond wire is then extended at 606 in FIG. 6 using the wire bonding tool 700, 704, 706 toward the conductive stud bump 150. The second end 139 of the conductive bond wire 137 is the bonded at 608 to the conductive stud bump 150 at the angle θ2 of 60 degrees or more to the plane of the planar side of the second conductive plate 148. At 610, the bond wire is then raised away from the conductive stud bump 150, and the wire bonding tool 700, 704, 706 clamps and pulls the wire 702 at 612 to separate the wire 702 from the bond wire 137.

Figure 24:
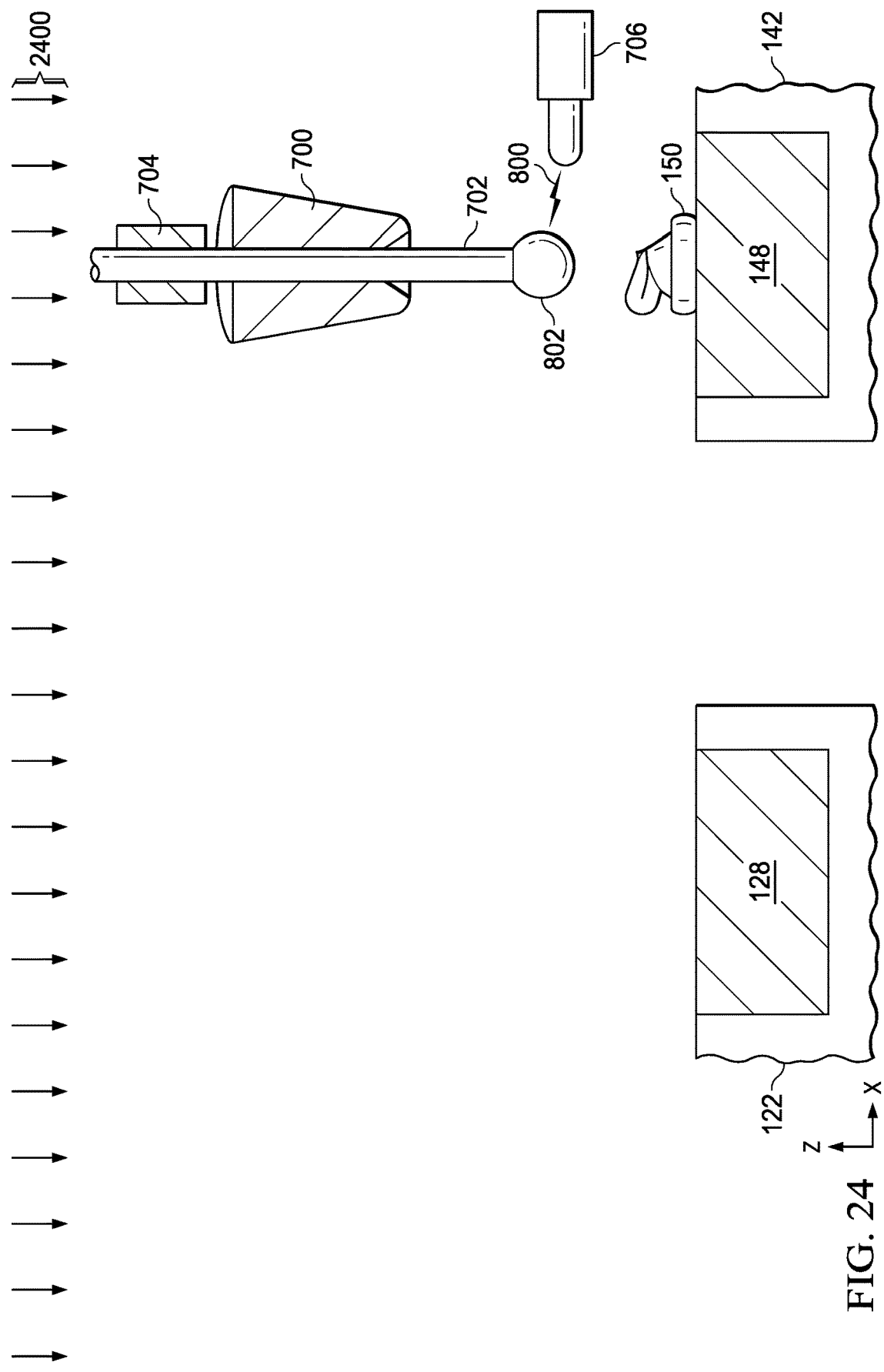
Figure 25:
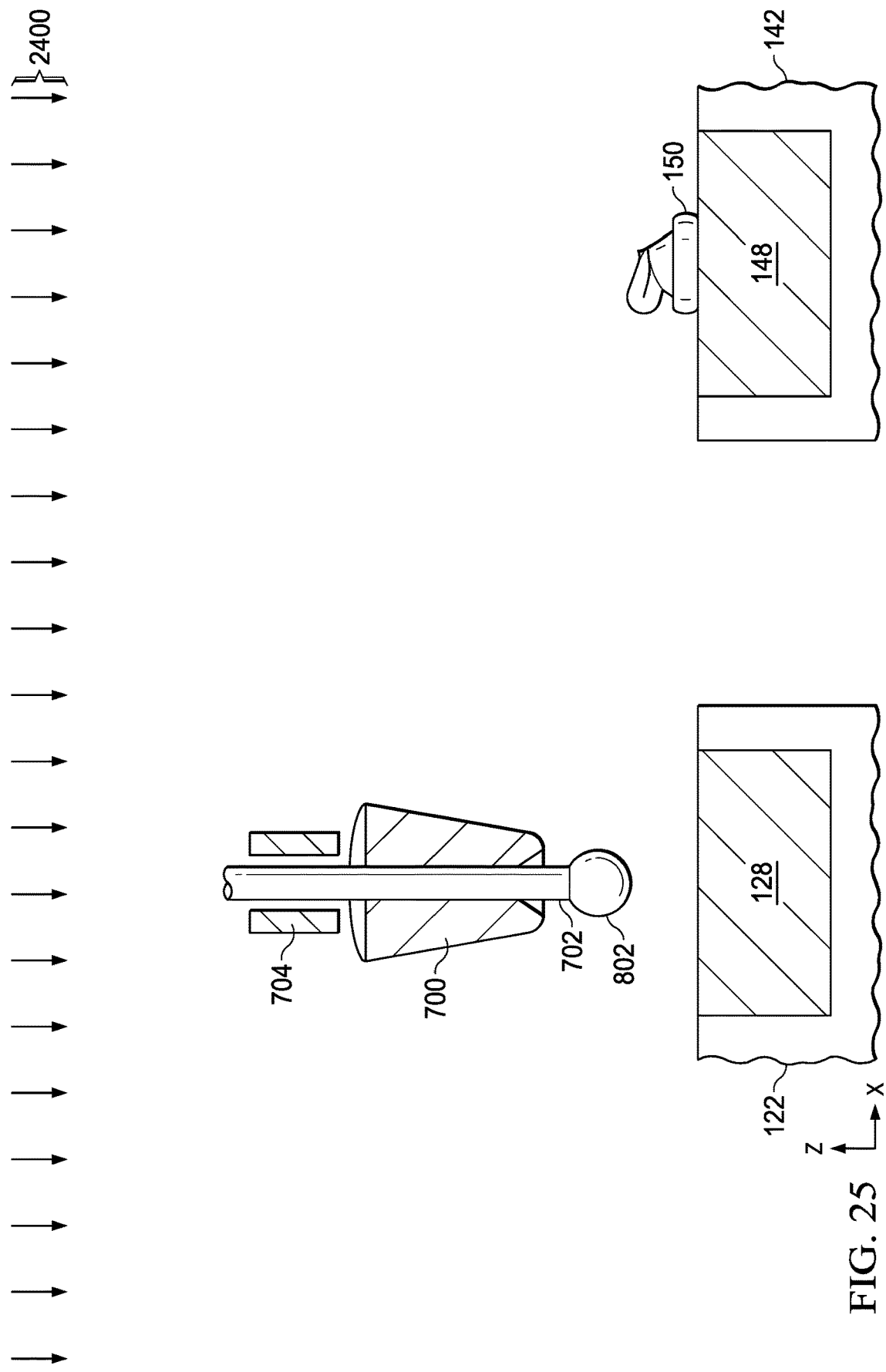
Figure 26:
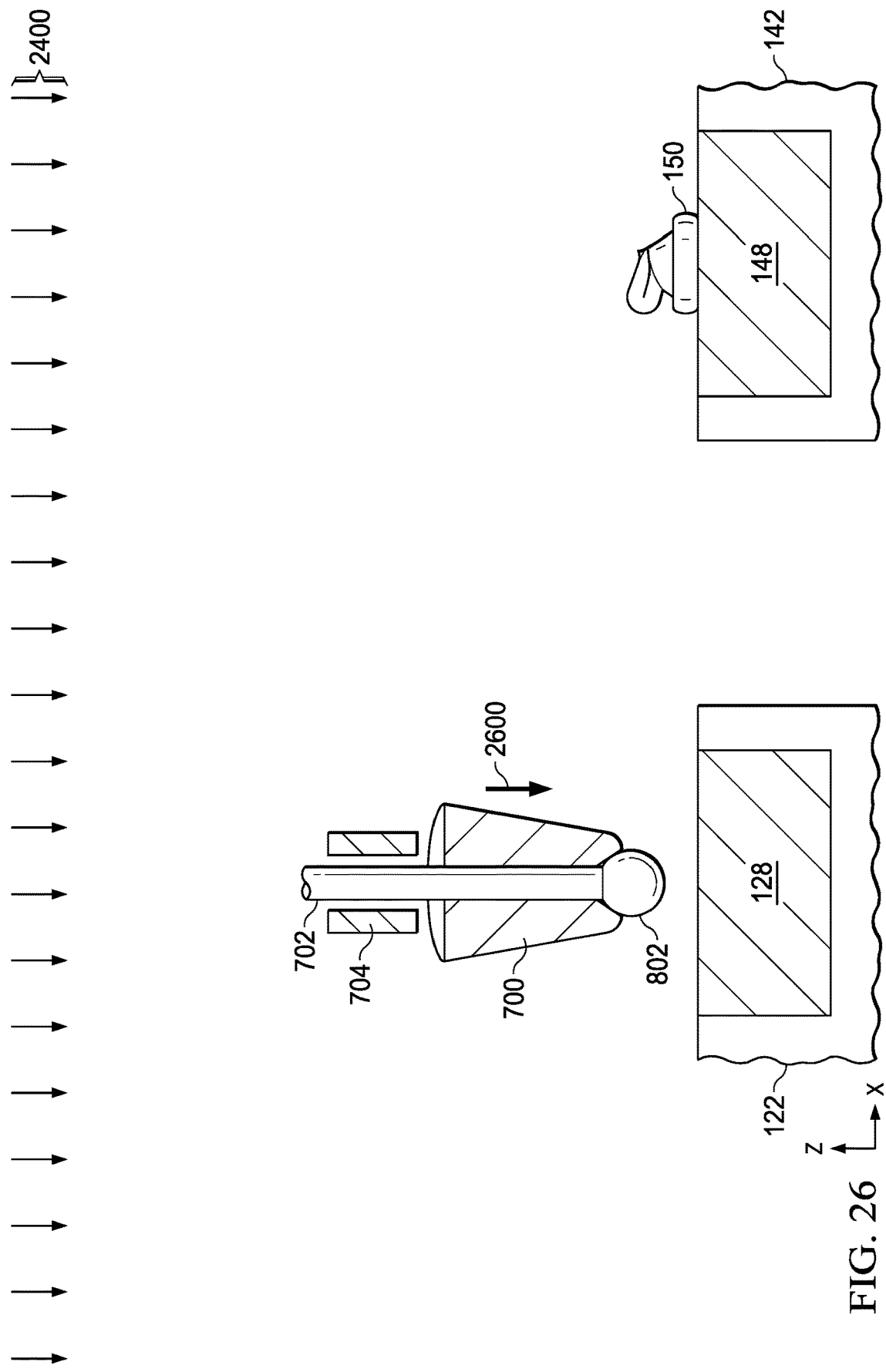
Figure 27:
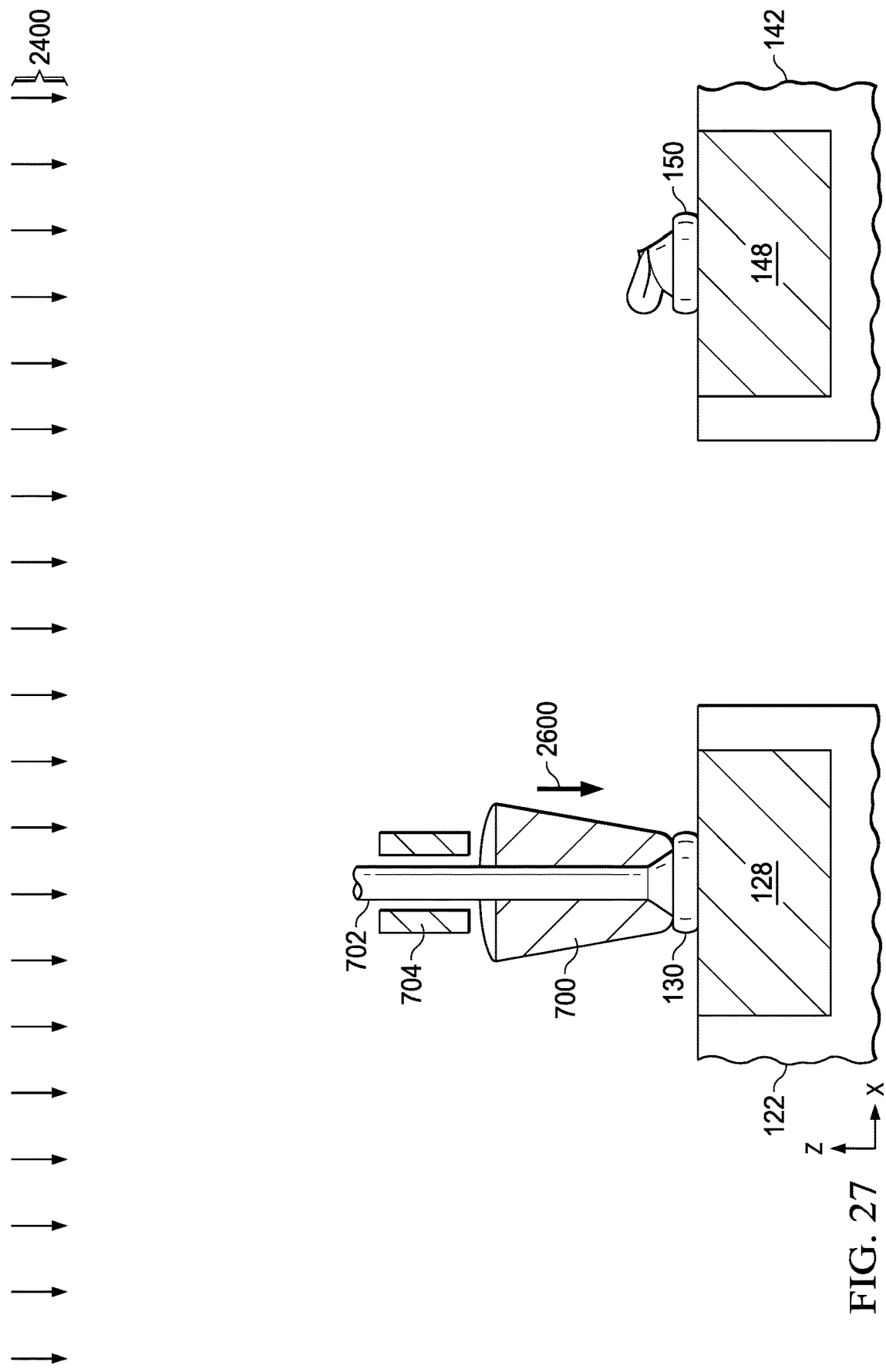

The process 2400 begins in FIG. 24 with the position control apparatus moving the nozzle 700 close to the electronic flame source 706, and another electronic flame off process is implemented, in which the electronic flame source 706 is energized to form a flame or arc 800 to melt the end of the wire 702 to form a ball 802 suspended by the remainder of the wire 702 while the clamp 704 remains closed as shown in FIG. 24. The clamp 704 is opened as shown in FIG. 25, and the position control apparatus moves the nozzle 700 downward in FIG. 26 along the direction 2600 to move the ball 802 toward the first conductive plate 128 with the clamp 704 open. The downward movement of the nozzle 700 continues with the ball 802 touching the top side of the first conductive plate 128 in FIG. 27 and progressively collapsing and laterally spreading to form the first connection 130 while the clamp 704 remains open. In one example, the connection 130 is a ball bond that joins a first end 138 of the prospective conductive bond wire 137 to the top side of the first conductive plate 128. In one example, the position control apparatus vibrates the nozzle at high (e.g., ultrasonic) frequencies to bond the ball 802 to the top side of the conductive plate 128 at 604 in FIG. 6 and as shown in FIG. 27, including lateral movement of the nozzle 700 back and forth along the X direction, or in a circular pattern in an X-Y plane, to form the ball bond connection 130.

Figure 28:
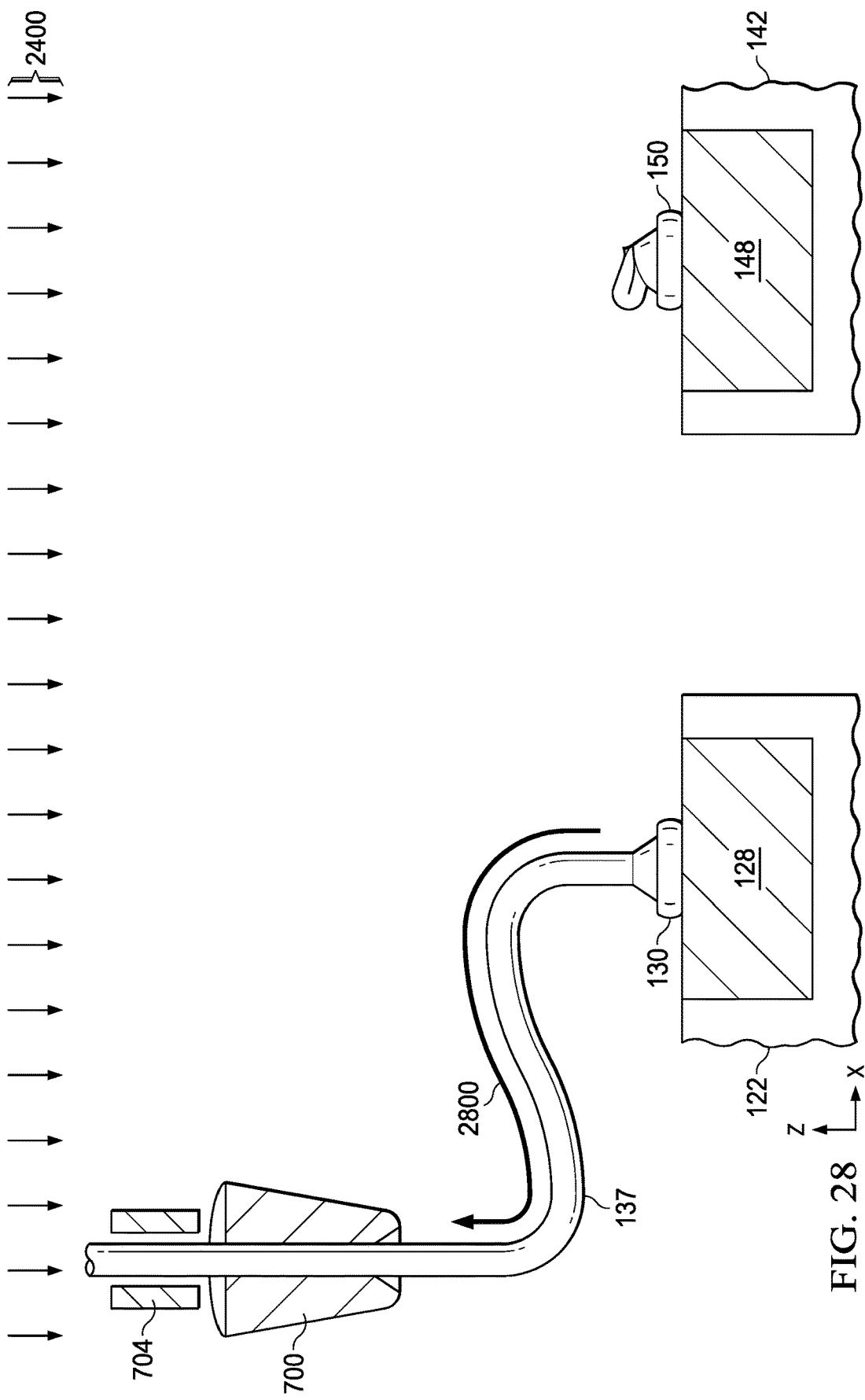
Figure 29:
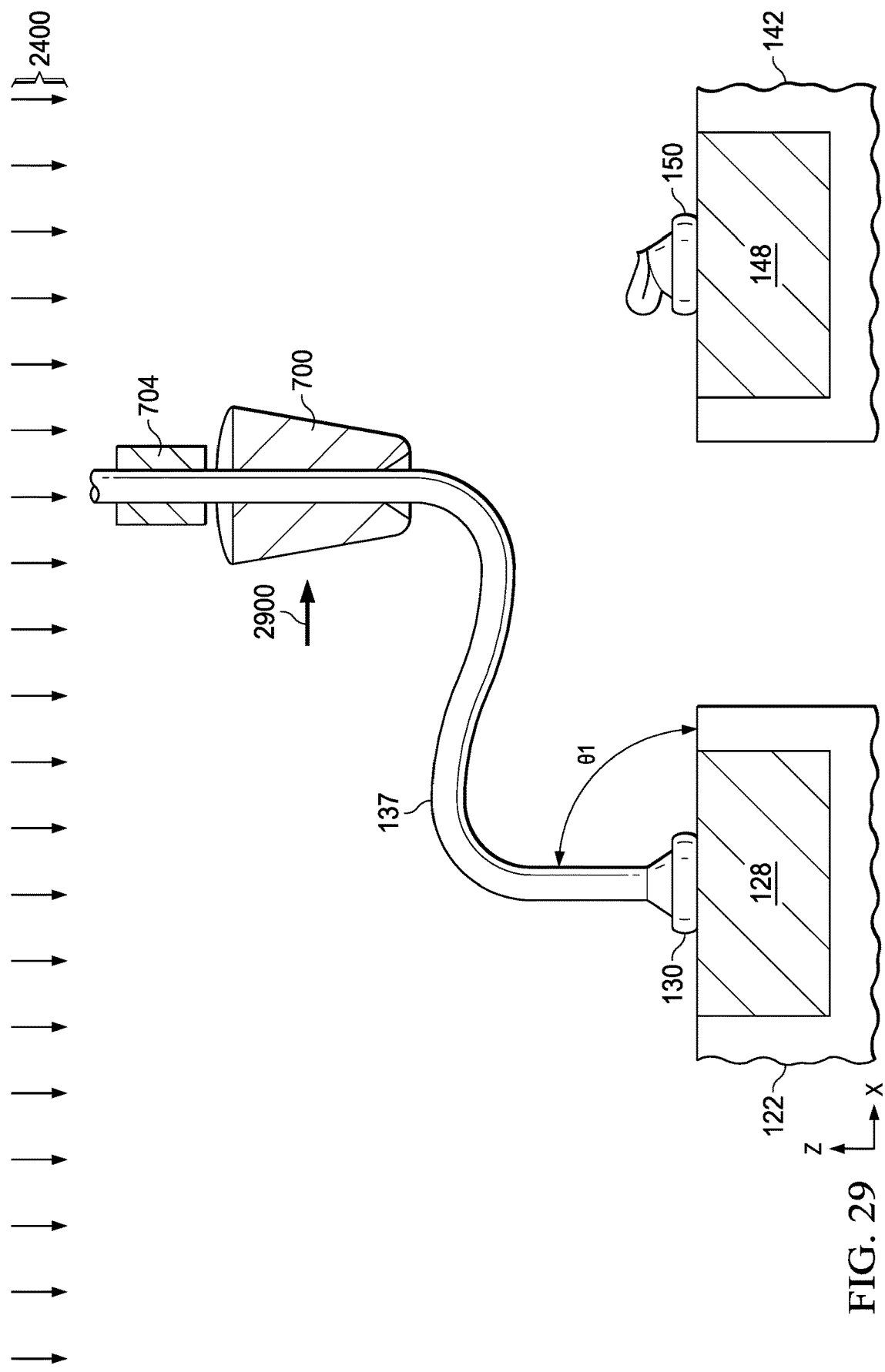
Figure 30:
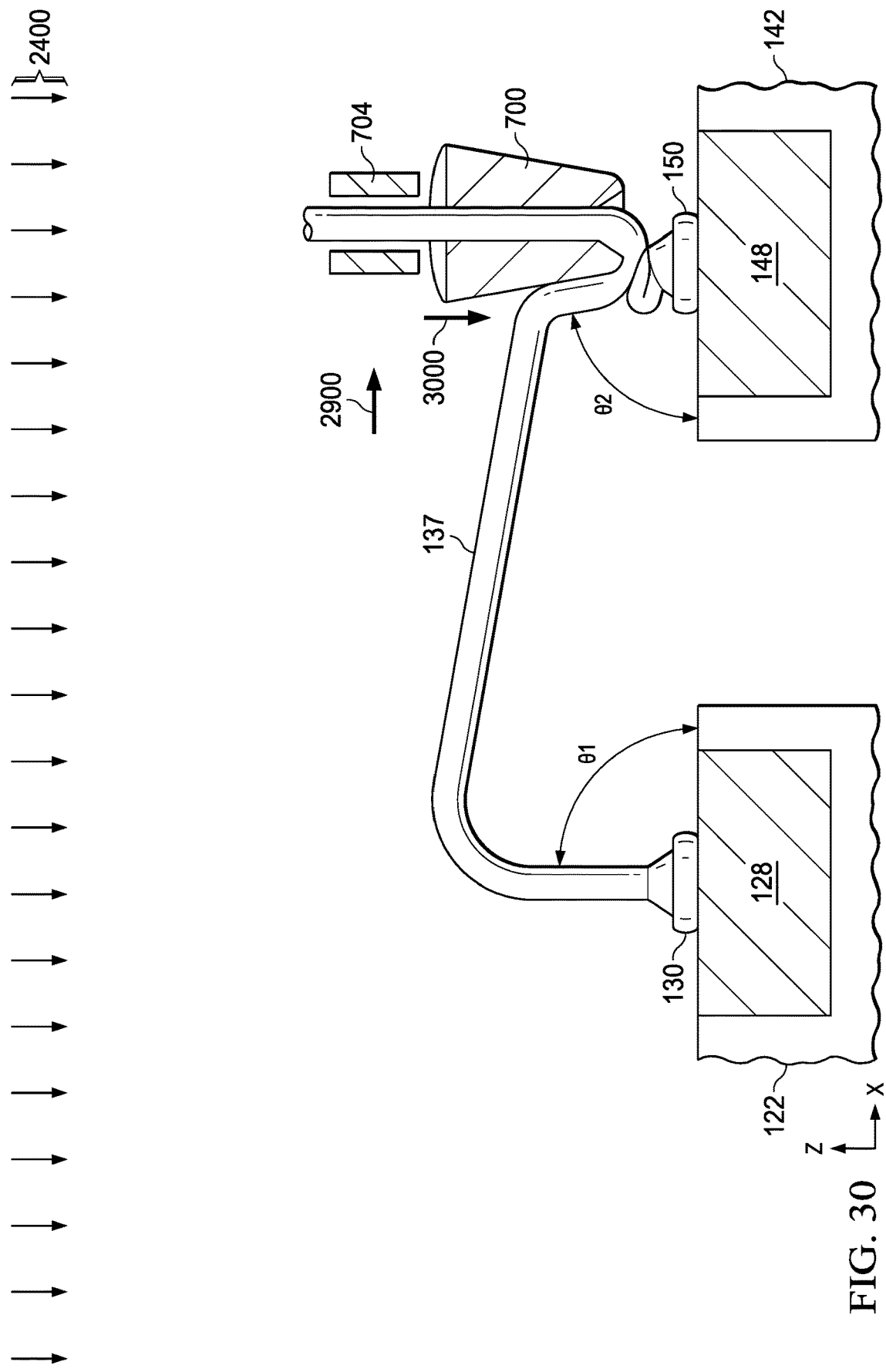

Continuing in FIG. 28, the position control apparatus extends the conductive bond wire 137 upward and laterally away from the conductive stud bump 150 and the second conductive plate 148 along a direction of the arrow 2800 with the clamp 704 open, and then the clamp 704 is closed and the position control apparatus moves the nozzle 700 toward the conductive stud bump 150 (e.g., 606 in FIG. 6) along the direction 2900 in FIG. 29 while the clamp 704 remains closed. The process 2400 continues in FIG. 30 with the position control apparatus moving the nozzle 700 further laterally along the direction 2900 until the center of the wire 700 is positioned above approximately half or less of the conductive stud bump 150 (e.g., above the tallest portion of the conductive stud bump) and then downward along the direction 3000 to cause the second end of the wire 137 to contact the conductive stud bump 150. In one example, the position control apparatus vibrates the nozzle at high (e.g., ultrasonic) frequencies to bond the second end 139 of the conductive bond wire 137 to half or less of the top of the conductive stud bump 150 (608 in FIG. 6 above), for example, including lateral movement of the nozzle 700 back and forth along the X direction, or in a circular pattern in an X-Y plane, to form the stitch bond connection.

Figure 31:
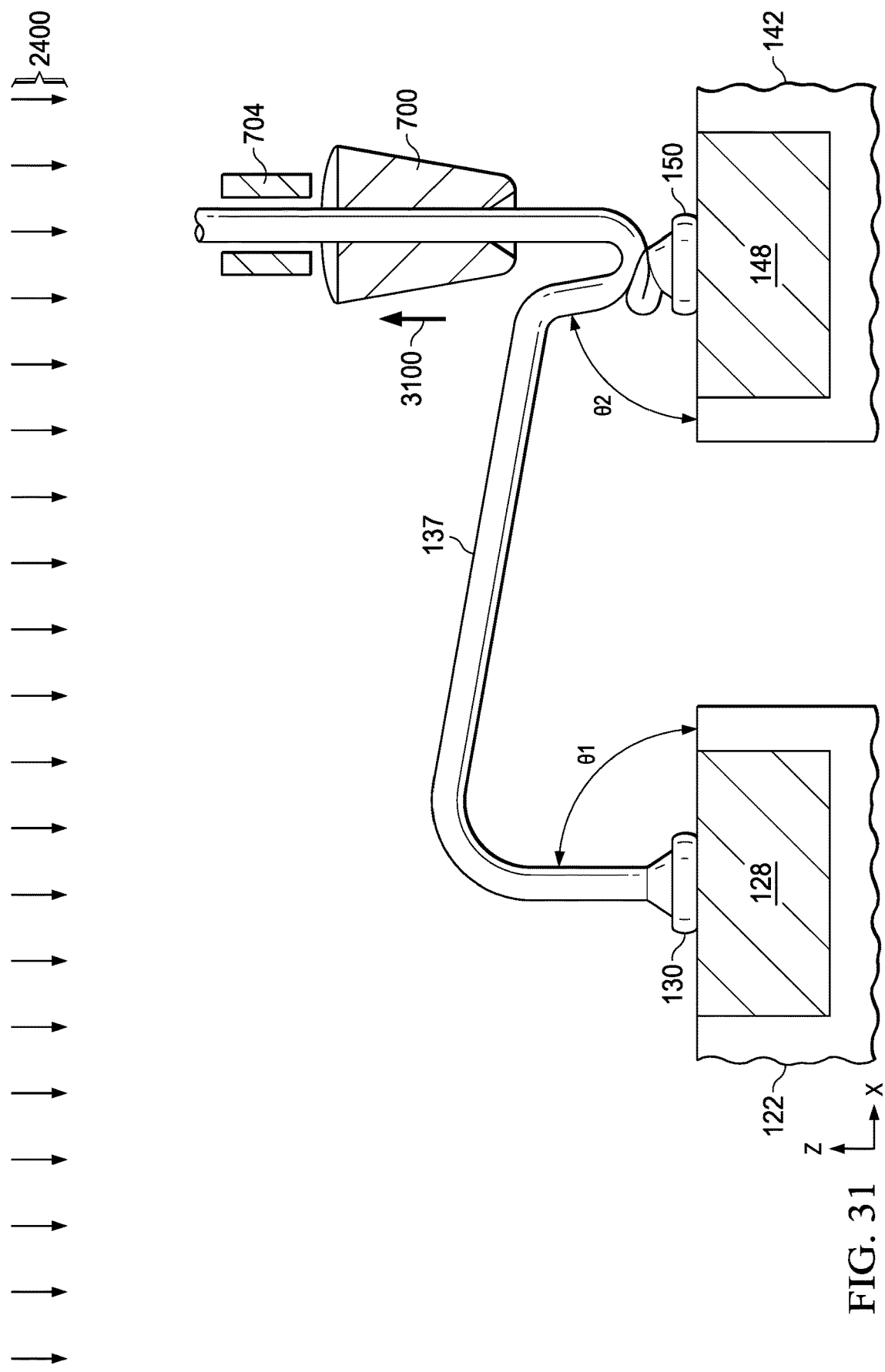
Figure 32:
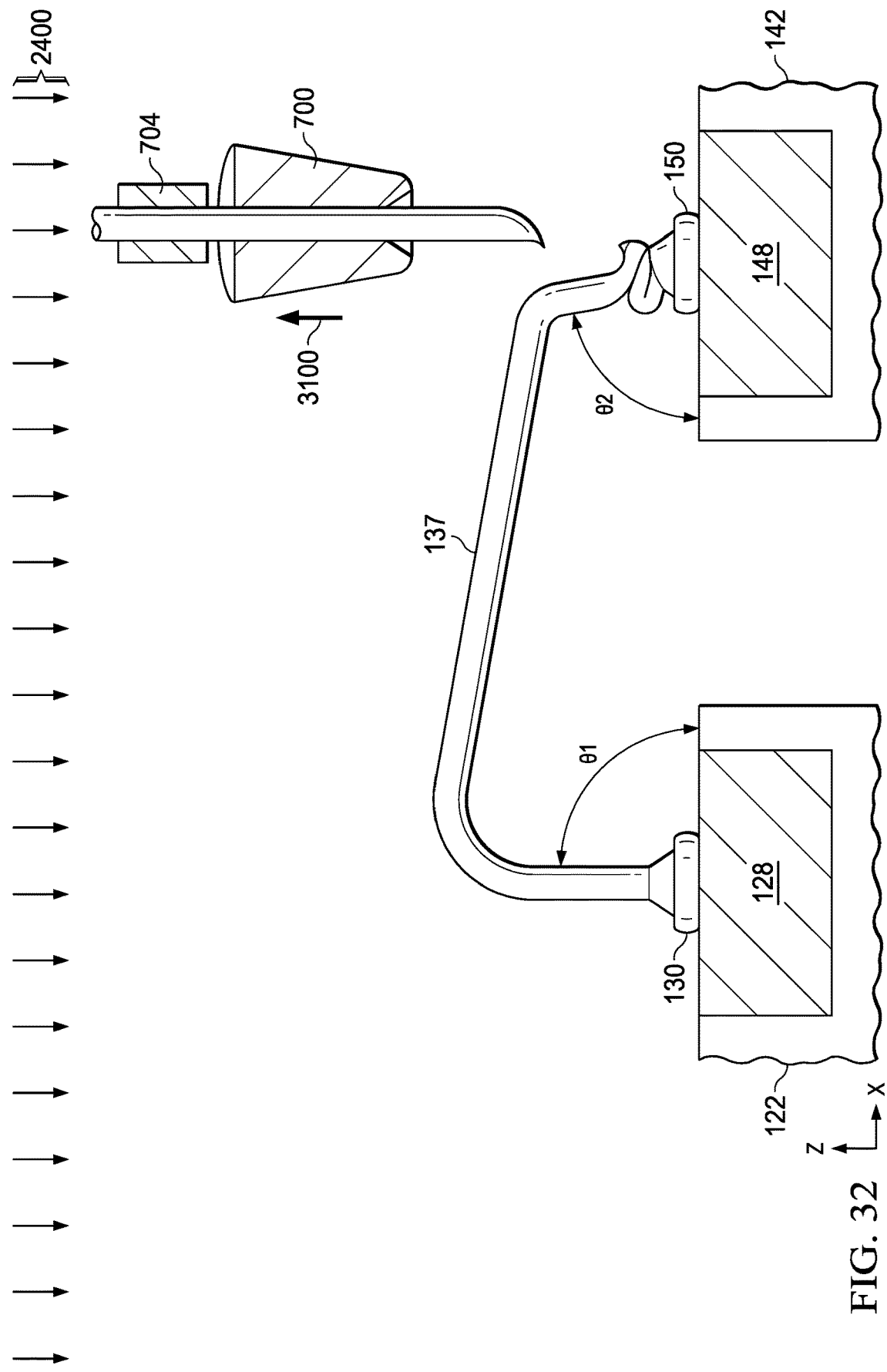

In FIG. 31, with the clamp 704 opened, the position control apparatus moves the nozzle 700 upward along the direction 3100. As shown in FIG. 32 (610 in FIG. 6), the position control apparatus closes the clamp 704 and raises the nozzle 700 upward along the direction 3100 further away from the conductive stud bump 150 to separate or break the wire 702 from the second end 139 of the bond wire 137. This completes the stitch bond to join the second end 139 of the conductive bond wire 137 to the conductive stud bump 150 at the angle θ2 of 60 degrees or more to the plane of the planar side of the second conductive plate 148. In this example, moreover, the second angle θ2 is less than or equal to 75 degrees and the stitch bond joins the second end 139 of the conductive bond wire 137 to half or less of the conductive stud bump 150. The described examples use the conductive stud bump 150 to holds up the wire loop and provide a steep stitch angle θ2 for a robust and stable wire bond connection to the top of the stud bump 150 for the wire landing. These examples can be constructed using conventional wire bonding tools and process conditions without requiring additional or new equipment. Moreover, the loop height of the bond wire 137 can be lower to facilitate reduced overall device package size while ensuring adequate spacing of the bond wire 137 from the lower capacitor plates 126 and 146 to mitigate or avoid arcing or other dielectric breakdown. The above examples also facilitate reduced manufacturing cost through use of less materials and the shared use of a single wire bonding tool to fabricate all the bond wire connections in one example, while enhancing high voltage package performance by less arcing.

Modifications are possible in the described examples, and other implementations are possible, within the scope of the claims.

What is claimed is:

1. A packaged electronic device, comprising:
   a first semiconductor die having a first conductive plate;
   a second semiconductor die having a second conductive plate and a conductive stud bump that extends outward from a planar side of the second conductive plate;
   a conductive bond wire having a first end and a second end, the first end of the conductive bond wire bonded to a planar side of the first conductive plate, the second end of the conductive bond wire bonded to the conductive stud bump, the first end of the conductive bond wire joined to the first conductive plate at a first angle to a plane of the planar side of the first conductive plate, the second end joined to the conductive stud bump at a second angle to the planar side of the second conductive plate, the first angle greater than or equal to 60 degrees, and the second angle greater than or equal to 60 degrees.

2. The packaged electronic device of claim 1, wherein the second angle is less than or equal to 75 degrees.

3. The packaged electronic device of claim 2, wherein the second angle is less than or equal to 70 degrees.

4. The packaged electronic device of claim 2, wherein the first end of the conductive bond wire is bonded to a planar side of the first conductive plate by a ball bond, and the second end of the conductive bond wire is bonded to the conductive stud bump by a stitch bond.

5. The packaged electronic device of claim 4, wherein the stitch bond of the second end joins half or less of the conductive stud bump.

6. The packaged electronic device of claim 2, wherein a stitch bond of the second end joins half or less of the conductive stud bump.

7. The packaged electronic device of claim 1, wherein the first end of the conductive bond wire is bonded to a planar side of the first conductive plate by a ball bond, and the second end of the conductive bond wire is bonded to the conductive stud bump by a stitch bond.

8. The packaged electronic device of claim 7, wherein the stitch bond of the second end joins half or less of the conductive stud bump.

9. The packaged electronic device of claim 1, wherein a stitch bond of the second end joins half or less of the conductive stud bump.

10. The packaged electronic device of claim 1, comprising a package structure that encloses the first semiconductor die, the second semiconductor die, the conductive stud bump and the conductive bond wire.

11. A method of manufacturing a packaged electronic device, the method comprising:
    fabricating a first semiconductor die having a first conductive plate;
    fabricating a second semiconductor die having a second conductive plate;
    attaching the first semiconductor die to a first die attach pad;
    attaching the second semiconductor die to a second die attach pad;
    forming a conductive stud bump extending outward from a planar side of the second conductive plate;
    bonding a first end of a conductive bond wire to the first conductive plate;

bonding a second end of the conductive bond wire to the conductive stud bump at an angle of 60 degrees or more to a plane of a planar side of the second conductive plate; and forming a package structure to enclose the first semiconductor die, the second semiconductor die, the conductive stud bump and the conductive bond wire.

12. The method of claim 11, wherein:
the conductive stud bump is formed using a wire bonding tool;
the first end of the conductive bond wire is bonded to the first conductive plate using the wire bonding tool; and
the second end of the conductive bond wire is bonded to the conductive stud bump using the wire bonding tool.

13. The method of claim 11, wherein:
bonding the first end of the conductive bond wire to the first conductive plate includes forming a ball bond to join the first end of the conductive bond wire to a planar side of the first conductive plate; and
bonding the second end of the conductive bond wire to the conductive stud bump includes forming a stitch bond to join the second end of the conductive bond wire to the conductive stud bump.

14. The method of claim 13, wherein the stitch bond of the second end joins half or less of the conductive stud bump.

15. The method of claim 14, wherein the second angle is less than or equal to 75 degrees.

16. The method of claim 11, wherein a stitch bond of the second end joins half or less of the conductive stud bump.

17. A wirebonding method, comprising:
using a wire bonding tool, forming a conductive stud bump on a planar side of a second conductive plate;
using the wire bonding tool, forming a ball bond that joins a first end of a conductive bond wire to a first conductive plate; and
using the wire bonding tool, forming a stitch bond that joins a second end of the conductive bond wire to the conductive stud bump.

18. The wirebonding method of claim 17, wherein the stitch bond joins the second end of the conductive bond wire to the conductive stud bump at an angle of 60 degrees or more to a plane of the planar side of the second conductive plate.

19. The wirebonding method of claim 18, wherein the stitch bond joins the second end of the conductive bond wire to half or less of the conductive stud bump.

20. The wirebonding method of claim 17, wherein the stitch bond joins the second end of the conductive bond wire to half or less of the conductive stud bump.

* * * * *